United States Patent
Yamaguchi et al.

(10) Patent No.: US 8,779,829 B2
(45) Date of Patent: Jul. 15, 2014

(54) LEVEL SHIFT CIRCUIT

(71) Applicant: Panasonic Corporation, Osaka (JP)

(72) Inventors: Satoshi Yamaguchi, Osaka (JP); Tomohiro Hirayama, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/781,031

(22) Filed: Feb. 28, 2013

(65) Prior Publication Data
US 2013/0176066 A1 Jul. 11, 2013

Related U.S. Application Data

(63) Continuation of application No. PCT/JP2011/000350, filed on Jan. 24, 2011.

(30) Foreign Application Priority Data

Sep. 30, 2010 (JP) .................................. 2010-221400

(51) Int. Cl.
*H03L 5/00* (2006.01)

(52) U.S. Cl.
USPC ........................................................ 327/333

(58) Field of Classification Search
None
See application file for complete search history.

(56) References Cited

U.S. PATENT DOCUMENTS

2007/0257724 A1  11/2007  Suzuki
2008/0001661 A1*  1/2008  Tachibana et al. ............ 330/253

FOREIGN PATENT DOCUMENTS

| JP | 2004-072829 A | 3/2004 |
| JP | 2007-306042 A | 11/2007 |
| JP | 2008-040543 A | 2/2008 |
| JP | 2009-081805 A | 4/2009 |

OTHER PUBLICATIONS

International Search Report mailed Apr. 12, 2011 issued in corresponding Interntational Application No. PCT/JP2011/000350.

* cited by examiner

*Primary Examiner* — Lincoln Donovan
*Assistant Examiner* — Khareem E Almo
(74) *Attorney, Agent, or Firm* — McDermott Will & Emery LLP

(57) ABSTRACT

The invention provides a level shift circuit which uses a low supply voltage level shift circuit as a first level shift element and a high supply voltage level shift circuit as a second level shift element and which is configured to switch these level shift circuits in accordance with supply voltage. The low supply voltage level shift circuit is in an operating state with its power supply turned ON when supply voltage is low and in a shut-down state with the power supply turned OFF to ensure the breakdown voltages of the elements when supply voltage is high. The high supply voltage level shift circuit is in a shut-down state with its power supply turned OFF when supply voltage is low and comes into an operating state with the power supply turned ON while ensuring the breakdown voltages of elements when supply voltage is high.

10 Claims, 15 Drawing Sheets

LEVEL SHIFT CIRCUIT

This is a continuation application under 35 U.S.C. 111(a) of pending prior International application No. PCT/JP2011/000350, filed on Jan. 14, 2011.

The disclosure of Japanese Patent Application No. 2010-221400 filed on Sep. 30, 2010 including specification, drawings and claims are incorporated herein by reference in its entirety.

BACKGROUND ART

1. Field of the Invention

The present invention relates to a technique for attaining high breakdown voltage in a level shift circuit without increasing the thickness of the gate oxides of the MOS transistors used therein, which circuit transmits a signal from its low supply voltage side to its high supply voltage side. More particularly, the invention relates to a technique suitably applicable to level shift circuits and semiconductor devices for use in, e.g., switching regulators and others.

2. Description of the Related Art

The level shift circuits, which have heretofore been developed, have such a configuration as shown in FIG. 13.

FIG. 13 shows one known level shift circuit that is cited in JP-A-2004-72829 (Page 11 and FIG. 6).

The known level shift circuit will be described with reference to FIG. 13.

In FIG. 13, numerals 76, 81 each designate an inverter; numerals 79, 80 designate a PMOS transistor (hereinafter referred to as a "PMOS"); numerals 77, 78 designate an NMOS transistor (hereinafter referred to as an "NOMS"); Vdd1 designates a first high potential side power supply; Vdd2 designates a second high potential side power supply; Vss1 designates a low potential side power supply; VIN designates a signal input terminal; and VOUT designates a signal output terminal.

In the known level shift circuit, the signal input terminal VIN is connected to the gate of the NMOS (78) and to the input terminal of the inverter (76) whose earth terminal is connected to the Vss1 and whose power supply terminal is connected to the Vdd1. The output terminal of the inverter (76) is connected to the gate of the NMOS (77). The PMOSs (79) and (80), whose sources are connected to the Vdd2, are interconnected, with the gates of the PMOS (79), (80) being connected to the drains of the PMOSs (80), (79) respectively. The drain of the PMOS (79) is connected to the Vss1 through the NMOS (77), and the drain of the PMOS (80) is connected to the Vss1 through the NMOS (78). The drain of the PMOS (80) is also connected to the input terminal of the inverter (81) whose earth terminal is connected to the Vss1 and whose power supply terminal is connected to the Vdd2. The output of the inverter (81) is connected to the signal output terminal VOUT.

This circuit is for level shifting an input signal VIN generated by a supply voltage [Vdd1−Vss1(GND)] to output an output signal VOUT whose amplitude differs from the input signal VIN, using a supply voltage [Vdd2−Vss1] that differs from the supply voltage [Vdd1−Vss1].

The level shift circuit shown in FIG. 13 is operable when the potential of the Vdd2 is lower than that of the Vdd1. However, if the Vdd2 becomes higher, a high potential difference [Vdd2−Vss1] is applied as the gate to source voltage VGS of the PMOS (79) and the PMOS (80) and therefore there is a need to increase the breakdown voltages (withstand voltages) of the elements. Generally, element breakdown caused by application of a high voltage across a gate and a source is avoided by increasing breakdown voltage by thickening the gate oxide of the element. However, thickening of the gate oxide is accompanied by an increase in the size of the element, which leads to not only an increase in the cost of the IC but also the problem that the threshold voltage Vth (that is, the operating voltage) of the MOS transistor increases and the inversion speed of the MOS transistor decreases.

To overcome the problem presented by the circuit shown in FIG. 13, a configuration such as shown in FIG. 12 is proposed by JP-A-2004-72829. FIG. 12 shows a known level shift circuit disclosed in JP-A-2004-72829 (Page 10, FIG. 1).

This known level shift circuit will be described with reference to FIG. 12.

Referring to FIG. 12, numerals 59, 73 each designate an inverter; numerals 68, 69 designate a PMOS; numerals 60, 61, 63, 64, 65, 71, 72 designate an NMOS; numerals 66. 67 designate a drain high breakdown voltage NMOS transistor (hereinafter referred to as a "drain high breakdown voltage NMOS"); numerals 62, 70 designate a resistor, numeral 74 designates a first constant current circuit; numeral 75 designates a second constant current circuit; Vdd1 designates a first high potential side power supply; Vdd2 designates a second high potential side power supply; Vss1 designates a first low potential side power supply; Vss2 designates a second low potential side power supply; VIN designates a signal input terminal and VOUT designates a signal output terminal.

The drain high breakdown voltage NMOSs are NMOS transistors in which the drain has high breakdown voltage and therefore element breakdown can be avoided even if a high voltage is applied across the gate and drain or across the source and drain.

This circuit is intended to level shift the input signal VIN generated by a supply voltage [Vdd1−Vss1] to output the output signal VOUT, using a supply voltage [Vdd2−Vss2] that is higher in potential than the supply voltage [Vdd1−Vss1]. Herein, the output signal VOUT has higher central potential than that of the input signal VIN.

According to JP-A-2004-72829, the operating condition for the circuit shown in FIG. 12 is as follows.

The following description is written in Page 4, Paragraph No. 0009.

"The above supply voltage [Vdd2−Vss2] is substantially the same in potential difference as the supply voltage [Vdd1−Vss1 (GND)] (e.g., 10V-5V) of a logic system, but only the potential of [Vdd2−Vss2] is higher than that of [Vdd1−Vss1]"

The following description is written in Page 5, Paragraph No. 0016.

"the reference potential for the high potential side (lower supply voltage) Vss2"

According to this operating condition, the voltage of the Vdd1 (lower supply voltage) is the same as that of the Vss2 (reference potential for the high potential side). The supply voltage [Vdd2−Vss2] is substantially the same as the supply voltage [Vdd1−Vss 1] in potential difference but higher than the supply voltage [Vdd1−Vss1] only in potential. This indicates that the potential difference of the supply voltage [Vdd2−Vss1] needs to be substantially twice that of the supply voltage [Vdd1−Vss1]. The circuit shown in FIG. 12 operates on the condition that the potential of the Vdd2 is higher than that of the Vdd1.

The level shift circuit shown in FIG. 12 is comprised of:

a pair of input MOS transistors NMOS (60), NMOS (61) that receive, at their gates, an input signal VIN and its inversion signal respectively;

current mirror-connected load MOS transistors PMOS (68), PMOS (69) whose sources are connected to the Vdd2;

drain high breakdown voltage MOS transistors NMOS (66), NMOS (67) and current limitation MOS transistors NMOS (64), NMOS (65) for limiting the currents flowing in the NMOS (66), NMOS (67) respectively, the NMOS (66) being connected in series between the input MOS transistor NMOS (60) and the load MOS transistor PMOS (68) whereas the NMOS (67) is connected in series between the input MOS transistor NMOS (61) and the load MOS transistor PMOS (69);

a first constant current circuit (74) that determines the amount of electric current flowing in the current limitation MOS transistors NMOS (64), NMOS (65);

a current supply MOS transistor NMOS (71) that supplies electric current in order to prevent the drain potential of the drain high breakdown voltage MOS transistor NMOS (67) from excessively dropping;

a second constant current circuit (75) that determines the amount of electric current flowing in the NMOS (71); and an inverter (73) that shapes the waveform of an output voltage to output the output voltage, the output voltage being generated at the drain of the load MOS transistor PMOS (69).

The sources of the NMOSs (60) and (61) are connected to the Vss1 and the input signal VIN is directly input into the gate of one of them. An inversion signal produced by inversion of the input signal VIN by the inverter (59) is input into the gate of the other NMOS, and the NMOSs (60), (61) are turned ON or OFF in accordance with the signal level of the input signal VIN.

The sources of the PMOSs (68), (69) are connected to the Vdd2, and the gate and drain of the PMOS (68) are connected together. The drain voltage of the PMOS (68) is applied to the gate of the PMOS (69).

The drains of the drain high breakdown voltage NMOSs (66), (67) are connected to the PMOS (68) side and the PMOS (69) side respectively. Their sources are connected to the NMOS (60) side and the NMOS (61) side respectively. The Vdd1 is connected to the gates of the NMOSs (66), (67) so as to apply voltage thereto. According to such NMOSs (66) and (67), even if high voltage is applied to their drains, the source potential is clamped to a clamp voltage (Vdd1−Vth) determined by the gate potential (Vdd1) and the threshold voltage Vth of the MOS transistors so that the high voltage is not applied to the elements NMOSs (64), (65), (60), (61) located on their source sides.

The NMOS (64) is connected in series between the NMOSs (60) and (66) whereas the NMOS (65) is connected in series between the NMOSs (61) and (67), and the NMOSs (64), (65) are current mirror-connected to the NMOS (63) that constitutes the first constant current circuit (74). When either the NMOS (60) or the NMOS (61) is in its ON state, the electric current flowing in its associated transistor NMOS (66) or NMOS (67) is limited to the amount of current determined by the first constant current circuit (74).

The first constant current circuit (74) is constituted by the NMOS (63) whose gate and drain are connected together and the resistor (62), the NMOS (63) and the resistor (62) being connected in series between the Vdd1 and the Vss1. The NMOS (71) is current mirror-connected to the NMOS (72) of the second constant current circuit (75) and feeds a current determined by the second constant current circuit (75) to an output node N11 when the potential of the output node 11 has dropped, so that the potential of the N11 is controlled to be prevented from becoming lower than the reference potential (lower supply voltage) Vss2 of the high potential side. As long as the potential of the N11 is prevented from becoming lower than the reference potential Vss2 by the current limitation with the NMOSs (64) and (65) or similar means, the NMOS (71) and the second constant current circuit (75) may be omitted. In the second constant current circuit (75), the resistor (70) and the NMOS (72) are connected in series between the Vdd2 and the Vss2. In the level shift circuit of the configuration described above, when the input signal VIN is at an H level, one (61) of the input NMOSs is turned ON so that current flows through the PMOS (69), the NMOS (67) and the NMOS (65), whereas the other NMOS (60) is turned OFF so that the electric current flowing in the PMOS (68), the NMOS (66) and the NMOS (64) is shut off. As a result, the potential of the N11 is brought into a Low state and the output signal VOUT of the inverter (73) becomes close to the level of the Vdd2.

On the other hand, when the input signal VIN is at an L level, one (61) of the input NMOSs is turned OFF so that the electric current flowing in the NMOSs (67) and (65) is shut off, while the other input NMOS (60) is turned ON so that electric current is allowed to flow in the PMOS (68), the NMOSs (66) and (64). Since the PMOS (68) and the PMOS (69) are current mirror connected, the drain voltage of the PMOS (69) enters an unsaturated region while charging the node connected to the N11 and, in consequence, the potential of the N11 becomes close to the level of the Vdd2 so that the output signal of the inverter (73) become close to the level of the Vss2.

The unsaturated region stated herein is a static characteristic of a MOS transistor designated by numeral 56 in FIG. 10, in which the drain to source voltage VDS is low, the drain current ID is low and the changes in ID relative to VDS are significant. Note that numeral 57 in FIG. 10 designates a saturated region.

In the level shift circuit of such a configuration, although a high voltage corresponding to the potential difference between the Vss1 and the Vdd2 is applied only across the gate and drain and across the source and drain of the NMOSs (66) and (67), element breakdown can be avoided because the drains of the NMOSs (66) and (67) have high breakdown voltages. More specifically, even if the level shifting amount of the level shift circuit increases, there is no need to increase the thickness of the gate oxides of the elements and therefore the area occupied by the circuit can be reduced and the operating speed can be increased as compared to the level shift circuit in which high breakdown voltage is ensured by thickening the gate oxides.

In the approach shown in FIG. 12, although high breakdown voltage can be ensured for the elements without increasing the thickness of the gate oxides, the Vdd2 does not operate at lower voltage than the Vdd1 so that low voltage operation cannot be performed. In addition, it has revealed the problem that in a configuration in which operation is performed by charging the input portion of the inverter (73), located in the last stage, with the current source, current consumption increases by increasing the operating speed.

SUMMARY OF INVENTION

The conventional level shift circuit shown in FIG. 13 can operate when the Vdd2 is lower than the Vdd1 in voltage, but requires increasing of the thickness of the gate oxides of the constituent elements of the level shift circuit in order to ensure breakdown voltage in cases the Vdd2 becomes high. However, the thickness of the gate oxides is increased at the expense of increased element sizes and, in consequence, increased area occupied by the whole circuit and increased IC cost. Further, it presents such problems that the threshold voltage Vth of the MOS transistors, that is, the operating voltage becomes high and the inversion speed of the MOS transistors decreases.

As described earlier, an operating condition for the conventional level shift circuit shown in FIG. 12 is that the potential difference of the supply voltage [Vdd2−Vss1] is substantially twice that of the supply voltage [Vdd1−Vss1] and therefore this level shift circuit presents the problem that it cannot operate when the Vdd2 is lower than the Vdd1.

In addition, the time taken for the potential of the N11, that is, the input portion of the inverter (73) located in the last stage to rise from an L level to an H level is determined by the behavior of the PMOS (69) when it enters the unsaturated region while charging the node connected to the N11 with the current outputted therefrom. Therefore, the electric current of the current mirror circuit constituted by the PMOSs (63), (64), (65) needs to be increased in order to reduce the rise time, which leads to an increase in electric current consumption.

The invention is directed to overcoming the foregoing problems presented by the prior art and therefore a primary object of the invention is to provide a level shift circuit and semiconductor device which are operable when the Vdd2 is lower than the Vdd1 in voltage and which operate with the Vdd2 not exceeding the breakdown voltages of the elements used therein when the Vdd2 becomes higher. These circuit and device ensure high operating speed without increasing electric current consumption so that low voltage operation, high breakdown voltage, low electric current consumption and high speed operation are enabled.

In the following description that discusses solutions to the problems, corresponding parts are indicated with the same bracketed reference numerals as in the embodiment described later for the purpose of clarifying the relevancy to the embodiments and facilitating the understanding of the invention. It should, however, be noted that the use of these reference numerals does not limit the invention to the configurations of the embodiments described herein but the invention covers a variety of elements that are configured and function similarly to those of the embodiments.

There is provided a level shift circuit according to a first aspect of the invention, in which a first amplitude input signal VIN generated by a supply voltage [Vdd1−Vss1(GND)] is level shifted to a second amplitude output signal VOUT generated by a supply voltage [Vdd2−Vss1]. To this end, this level circuit uses a low supply voltage level shift circuit as a first level shift element (1), which is brought into an operating state by turning its power supply ON when the Vdd2 is lower than the Vdd1 in voltage and is brought into a shut-down state by turning the power supply OFF while ensuring the breakdown voltages of the elements used therein when the Vdd2 is higher. This level shift circuit uses a high supply voltage level shift circuit as a second level shift element (2), which is brought into a shut-down state by turning its power supply OFF when the voltage of the Vdd2 is lower and is brought into an operating state by turning the power supply ON while ensuring the breakdown voltages of its elements when the voltage of the Vdd2 is higher. The level shift circuit also includes a comparator circuit (3), a resistor (4), a resistor (5), and a reference voltage supply (6). The power supply ON/OFF states of the first level shift element (1) and the second level shift element (2) are determined by the output of the comparator circuit (3). The comparator circuit (3) is configured to output a result of comparison between a reference voltage given by the reference voltage supply (6) and a voltage obtained by dividing the voltage of the Vdd2 between the resistor (4) and the resistor (5).

The level shift circuit thus configured according to the first aspect is designed to switch the power supply ON/OFF states of the first level shift element (1) and the second level shift element (2) in accordance with the voltage of the Vdd2. When the voltage of the Vdd2 is lower than that of the Vdd1, the level shift circuit operates with the first level shift element (1), whereas when the voltage of the Vdd2 is higher, the level shift circuit operates with the second level shift element (2), with the breakdown voltages of the elements being ensured. Accordingly, this enables it to provide a level shift circuit and semiconductor device which are operable at low voltages and have high breakdown voltage.

There is provided a level shift circuit according to a second aspect of the invention, which comprises the first level shift element (1), the second level shift element (2), the comparator circuit (3), the resistor (4), the resistor (5), and the reference voltage supply (6). In this level shift circuit, the first level shift element (1) associated with the first aspect shifts the level of the first amplitude input signal VIN to output the second amplitude output signal VOUT. The circuit for outputting the second amplitude signal is configured such that a drain high breakdown voltage MOS transistor (hereinafter referred to as a "drain high breakdown voltage MOS") is provided for a node where high potential difference occurs. This drain high breakdown voltage MOS can be turned ON and OFF and receives a constant voltage applied to the drain or source thereof.

The drain high breakdown voltage MOS stated herein is a MOS transistor in which its drain is designed to have a high breakdown voltage so that element breakdown can be avoided even if high voltage is applied across the gate and drain or across the source and drain.

In the level shift circuit thus configured according to the second aspect, the first level shift element (1) can operate when the Vdd2 is lower than the Vdd1 in voltage and is brought into a shut-down state by turning its power supply OFF when the Vdd2 becomes higher, so that the breakdown voltages of the elements can be ensured thanks to the provision of the above drain high breakdown voltage MOS. In addition, when the power supply is OFF, the shutdown state of the first level shift element (1) can be confirmed without use of an additional circuit by monitoring the constant voltage applied to the drain high breakdown voltage MOS.

There is provided a level shift circuit according to a third aspect of the invention, which comprises the first level shift element (1), the second level shift element (2), the comparator circuit (3), the resistor (4), the resistor (5), and the reference voltage supply (6). In this level shift circuit, the second level shift element (2) associated with the first aspect shifts the level of the first amplitude input signal VIN to output the second amplitude output signal VOUT. This level shift circuit is configured such that the gate of a PMOS transistor in the output stage is provided with a current feed capacity UP switching element (55) having the function of switching current feed capacity and is configured to operate while the breakdown voltages of the elements used in the circuit being ensured, which elements include the current feed capacity UP switching element (55).

The level shift circuit thus configured according to the third aspect is such that when the voltage of the Vdd2 becomes higher, the second level shift element (2) operates with a voltage not exceeding the breakdown voltages of the elements used therein. This level shift circuit is able to perform high speed operation with low electric current consumption thanks to the function of the current feed capacity UP switching element (55).

There is provided a level shift circuit according to a fourth aspect of the invention, that uses the first level shift element (1) of the level shift circuit associated with the second aspect alone. This level shift circuit operates when the Vdd2 is lower than Vdd1 in voltage and is brought into a shut-down state with its power supply turned OFF when the Vdd2 becomes higher, so that the breakdown voltages of the elements can be maintained. Further, when the power supply is OFF, the shut down state of the level shift circuit according to the fourth aspect can be confirmed without use of an additional circuit by monitoring the constant voltage.

There is provided a level shift circuit according to a fifth aspect of the invention that uses the second level shift element (2) of the level shift circuit associated with the third aspect alone. When the Vdd2 becomes higher, this level shift circuit operates with a voltage not exceeding the breakdown voltages of the elements used therein. The function of the current feed capacity UP switching element (55) enables the level shift circuit to perform high speed operation with low electric current consumption.

The invention provides a level shift circuit in which a low supply voltage level shift circuit and a high supply voltage level shift circuit are switched by a comparator circuit so that either one of these level shift circuits can be selectively used according to a supply voltage to be applied. In addition, the level shift circuit of the invention is operable even when the Vdd2 is lower than the Vdd1 in voltage and is able to perform high speed operation with low electric current consumption while the breakdown voltages of the elements being maintained, when the supply voltage of the Vdd2 is higher.

The above and further objects, features and advantages of the present invention will more fully be apparent from the following detailed description of preferred embodiments with reference to accompanying drawings.

DETAILED DESCRIPTION OF PREFERRED EMBODIMENTS

Figure 1:
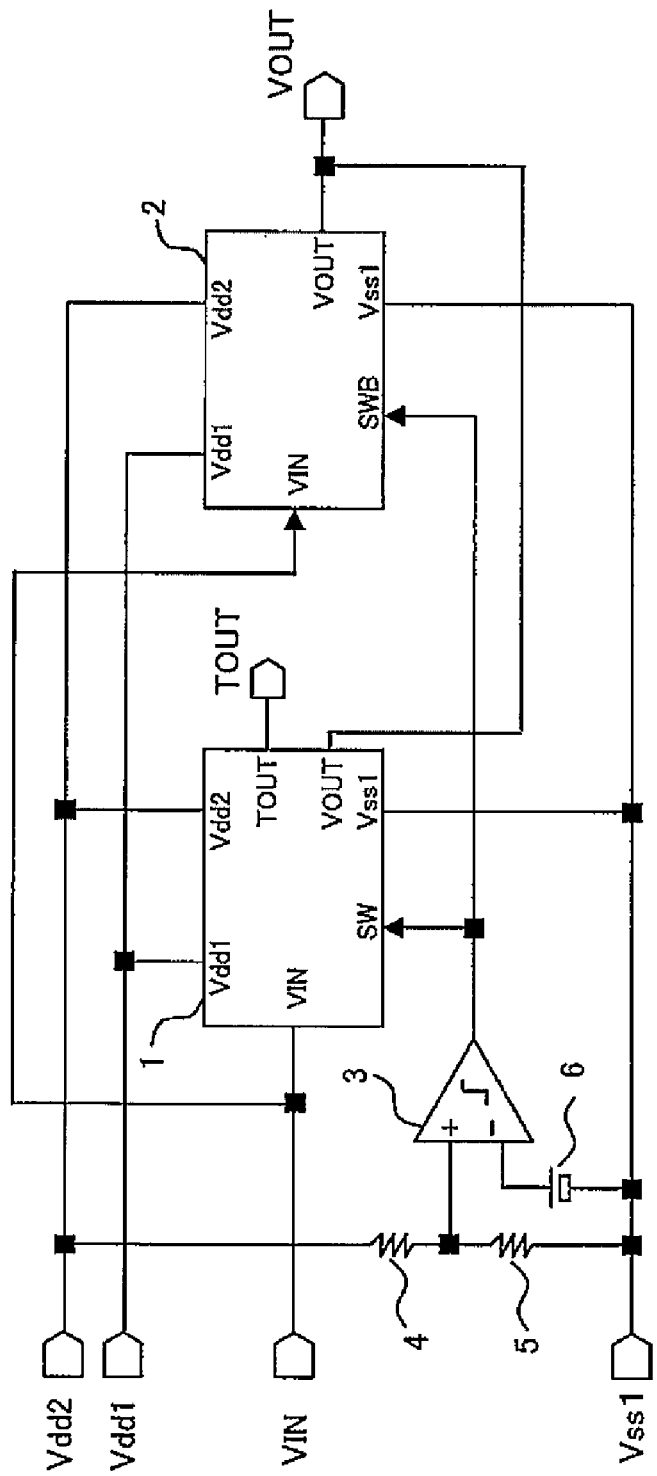
FIG. 1 is a configuration diagram of a first embodiment.

Referring now to the accompanying drawings, the level shift circuit of the invention will be described according to preferred embodiments. In the following description of the embodiments, the constituent elements designated by the same reference numerals have substantially the same functions, configurations and operations and repetitive explanation of elements having the same function is omitted. It should also be noted that the description of the embodiments is to be construed as illustrative only, and similar level shift circuits constructed on the basis of the same technical idea as of the invention are all contemplated as within the scope of the invention.

[First Embodiment]

FIG. 1 is a diagram showing the configuration of a level shift circuit according to a first embodiment of the invention.

In FIG. 1, numeral 1 designates a first level shift element; numeral 2 designates a second level shift element; numeral 3 designates a comparator circuit; numerals 4, 5 each designate a resistor; numeral 6 designates a reference voltage supply; Vdd1 designates a first high potential side power supply; Vdd2 designates a second high potential side power supply; Vss1 designates a low potential side power supply; VIN designates a signal input terminal; VOUT designates a signal output terminal; and TOUT designates an ON/OFF determination terminal.

The first level shift element (1) is a circuit for level shifting a first amplitude input signal VIN generated by a supply voltage [Vdd1−Vss1] to output a second amplitude output signal VOUT generated by a supply voltage [Vdd2−Vss1] and its power supply can be turned ON and OFF in response to a signal inputted through an SW terminal. When the voltage of the Vdd2 is lower than that of the Vdd1, the first level shift element (1) functions to output a signal from a VOUT terminal. When the supply voltage of the Vdd2 is higher, the power supply is turned OFF in response to a signal inputted through the SW terminal so that the first level shift element (1) comes into a shut-down state, while ensuring the breakdown voltages of the elements.

Further, the TOUT terminal has the function of monitoring the voltage within the circuit. In the shut-down state with the power supply turned OFF, it outputs constant voltage, and in the operating state with the power supply turned ON, it outputs a signal having substantially the same amplitude as of the VOUT signal.

The second level shift element (2) is a circuit for level shifting the first amplitude input signal VIN to output the second amplitude output signal VOUT and its power supply is turned ON and OFF in the opposite way to the first level shift element (1) in response to a signal inputted through an SWB terminal. When the supply voltage of the Vdd2 is higher, it functions to operate with the power supply turned ON, while ensuring the breakdown voltages of the elements.

The comparator circuit (3) functions to compare an input voltage obtained by dividing a supply voltage [Vdd2−Vss1] between the resistor (4) and the resistor (5) with a reference voltage V6 given by the reference voltage supply (6) to change its output from an L level to an H level or vice versa in accordance with the difference between the input voltage and the reference voltage.

The output terminal of the comparator circuit (3) is connected to the SW terminal of the first level shift element (1)

and the SWB terminal of the second level shift element (2). A VIN signal input terminal is connected to the VIN terminal of the first level shift element (1) and the VIN terminal of the second level shift element (2). The VOUT signal output terminal is connected to the VOUT terminal of the first level shift element (1) and a VOUT terminal of the second level shift element (2).

The Vdd1 terminal of the first level shift element (1) is connected to the Vdd1 that is the first high potential side power supply, its Vdd2 terminal is connected to the Vdd2 that is the second high potential side power supply, and its earth terminal is connected to the low potential side power supply.

The Vdd1 terminal of the second level shift element (2) is connected to the Vdd1 that is the first high potential side power supply, its Vdd2 terminal is connected to the Vdd2 that is the second high potential side power supply, and its earth terminal is connected to the low potential side power supply.

The operation of the level shift circuit shown in FIG. 1 and having the above configuration will be described in detail.

Figure 9:
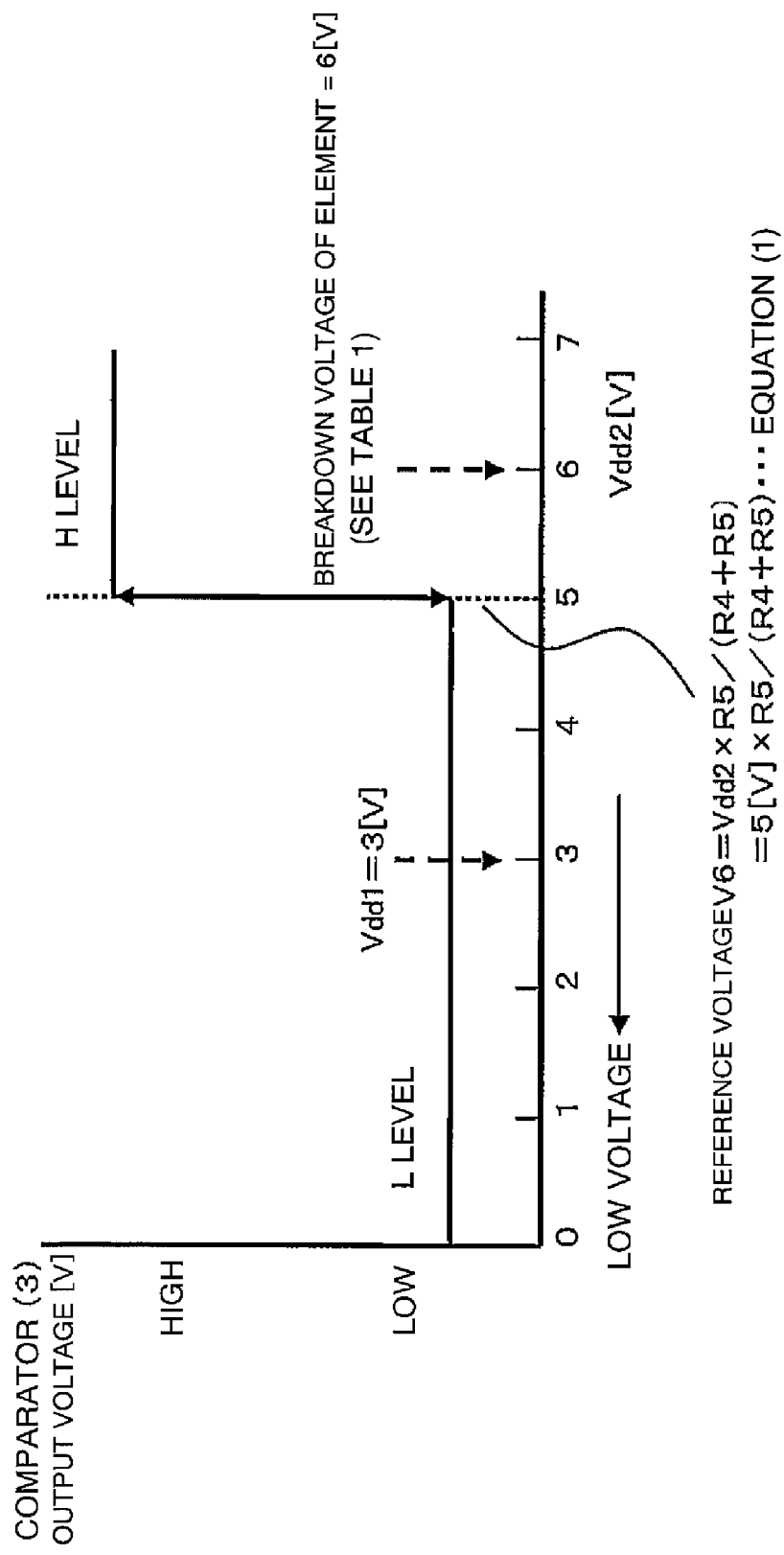
FIG. 9 shows input and output characteristics of a comparator circuit (3) according to the first embodiment.
Figure 10:
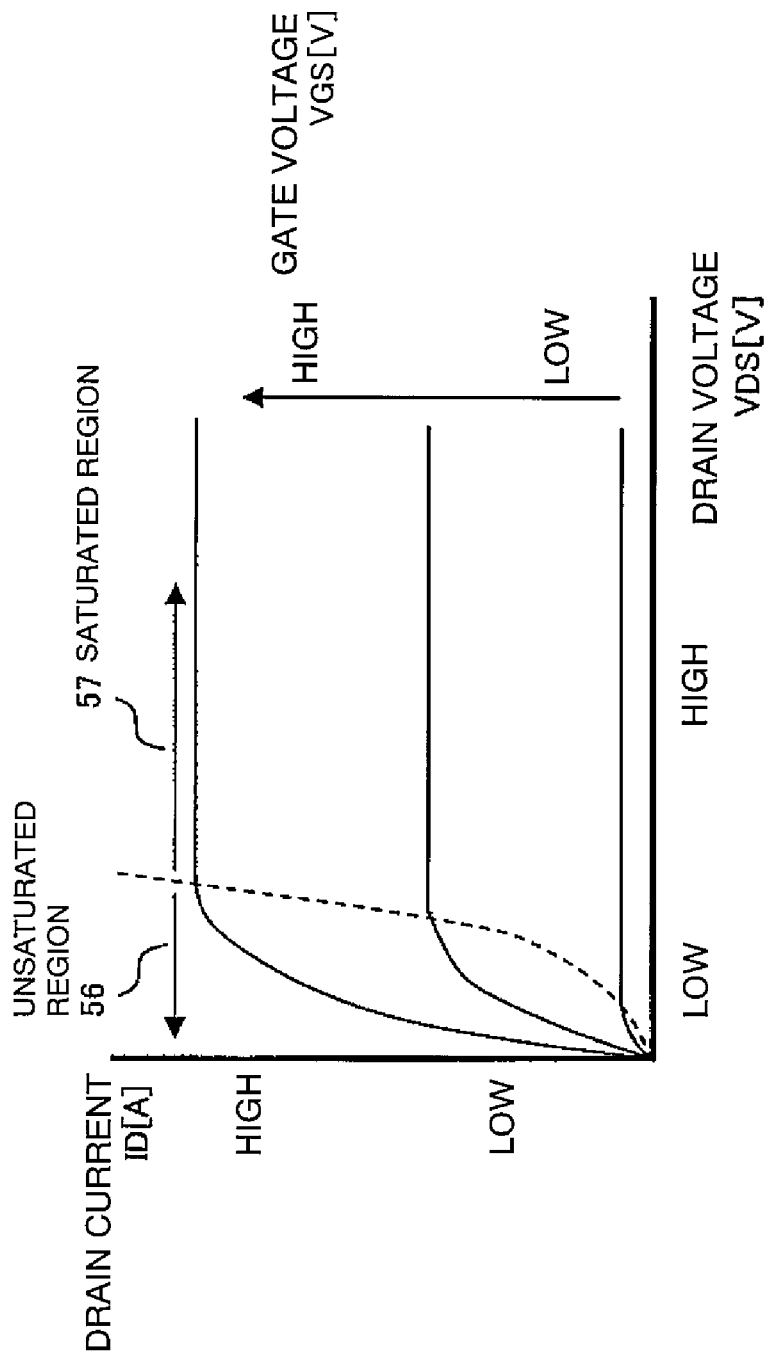
FIG. 10 is a static characteristic VDS-ID diagram of a MOS transistor.

FIG. 9 shows the input/output characteristics of the comparator circuit (3) by way of concrete example.

The input/output characteristics shown in FIG. 9 are obtained under the condition that the reference voltage V6 is represented by the following equation (1) and is equal to the above input voltage when Vdd2=5V. When the input voltage is lower than the reference voltage V6, the output of the comparator circuit (3) is at an L level whereas when the input voltage is higher than the reference voltage V6, the output of the comparator circuit (3) is at an H level.

In the equation (1), R5 designates the resistance value of the resistor (5) and R4 designates the resistance value of the resistor (4).

Reference voltage $V6=5[V] \times R5/(R4+R5)$     (1)

The reference voltage V6 at which the output of the comparator changes from an L level to an H level or vice versa is set to such a value that the voltage of the Vdd2 is higher than that of the Vdd1 and does not exceed the breakdown voltages of the elements of the semiconductor device. TABLE 1 shows the breakdown voltages of the respective elements used in a concrete circuit example described later.

TABLE 1

Table of Example of Transistor Breakdown Voltages

| transistor types | breakdown voltage categories | breakdown voltage values [V] | transistor Nos. |
|---|---|---|---|
| MOS transistors | VGS | 6 | 12, 13, 14, 15, 16, 18, 19, 20, 21, 23, 26, 27, 30, 31, 34, 41, 42, 44, 45, 46, 48, 49, 51, 52 |
|  | VGD | 6 |  |
|  | VDS | 6 |  |
| drain high breakdown voltage MOS transistors | VGS | 6 | 17, 22, 24, 25, 40, 47, 50, 53, 54 |
|  | VGD | 15 |  |
|  | VDS | 15 |  |

The lowest breakdown voltage shown in TABLE 1 is 6[V]. In the example shown in FIG. 9, the voltage of the Vdd2, which is higher than that of the Vdd1 and does not exceed 6[V], is set to 5V.

In the level shift circuit of the above-described configuration, the power supply ON/OFF states of the first level shift element (1) and the second level shift element (2) are switched according to the voltage value of the Vdd2. When the Vdd2 is lower than the Vdd1 in voltage, the power supply for the first level shift element (1) is turned ON to level shift the first amplitude input signal VIN to output the second amplitude output signal to the VOUT terminal, while the TOUT terminal outputting a signal having substantially the same amplitude as of the signal outputted to the VOUT. At that time, the second level shift element (2) is in a shut-down state with its power supply turned OFF.

If the voltage of the Vdd2 rises after that and the voltage inputted to the comparator becomes higher than the reference voltage V6, the first level shift element (1) comes into a shut-down state with its power supply turned OFF while maintaining the breakdown voltages of the elements. The TOUT terminal outputs a constant voltage so that it can be confirmed the first level shift element (1) is in the shut-down state. In the meantime, the second level shift element (2) comes into an operating state with its power supply turned ON while ensuring the breakdown voltages of the elements and level shifts the first amplitude input signal VIN to output the second amplitude output signal to the VOUT terminal.

The above-described operation exerts such an effect that, even when the Vdd2 is lower than the Vdd1 in voltage, operation can be performed and when the voltage of the Vdd2 is higher, operation is performed with the breakdown voltages of the elements being ensured. Further, it has the effect of easily confirming the power supply OFF state of the first level shift element (1) which has been shut down by turning its power supply OFF.

[Second Embodiment]

Figure 2:
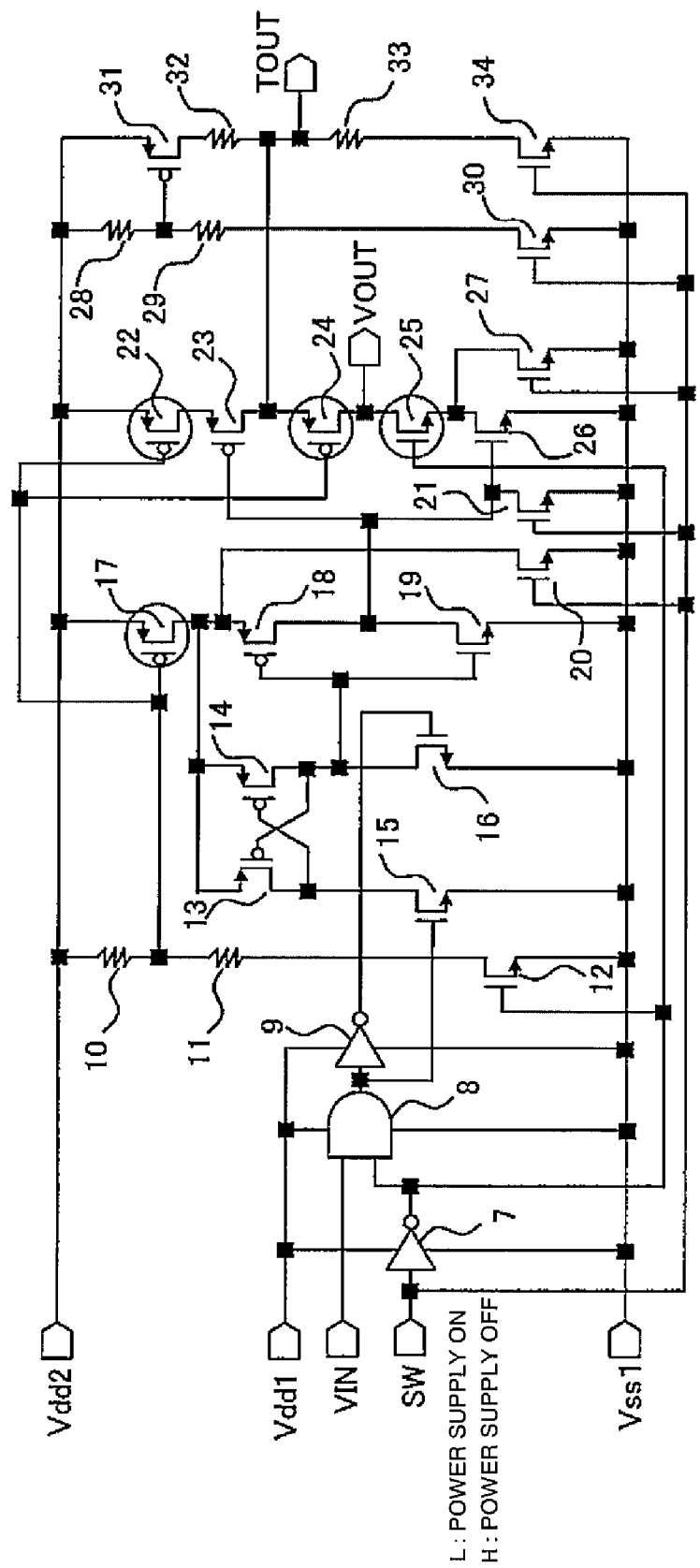
FIG. 2 is a configuration diagram of second and fourth embodiments.

FIG. 2 shows the configuration of the level shift circuit according to the second embodiment, which is a concrete configuration suitably applicable to the first level shift element (1) of the first embodiment.

In FIG. 2, numerals 7, 9 each designate an inverter; numeral 8 designates an AND; numerals 10, 11, 28, 29, 32, 33 designate a resistor; numerals 13, 14, 18, 23, 31 designate a PMOS; numerals 17, 22, 24 designate a drain high breakdown voltage PMOS transistor (hereinafter referred to as a "drain high breakdown voltage PMOS"); numerals 12, 15, 16, 19, 20, 21, 26, 27, 30, 34 designate an NMOS; numeral 25 designates a drain high breakdown voltage NMOS, Vdd1 designates a first high potential side power supply; Vdd2 designates a second high potential side power supply; Vss1 designates a low potential side power supply; SW designates a power supply ON/OFF switching terminal; VIN designates a signal input terminal; VOUT designates a signal output terminal; and TOUT designates an ON/OFF determination terminal.

The drain high breakdown voltage PMOSs stated herein are PMOS transistors designed to avoid element breakdown even when high voltage is applied across the gate and drain or across the source and drain because the drain is so formed as to have high breakdown voltage.

The power supply terminals of the inverters (7), (9) and the AND (8) are connected to the Vdd1 and their earth terminals are connected to the Vss1.

The output of the SW terminal enters the input of the inverter (7) and the gates of the NMOSs (20), (21), (27), (30), (34), and the output of the inverter (7) is connected to either one of the inputs of the AND (8) and to the gates of the NMOS (12) and the drain high breakdown voltage NMOS (25).

The drain of the NMOS (12) is connected to the Vdd2 through the resistors (11) and (10), and the node, at which the resistors (11), (10) are interconnected, is connected to the gates of the drain high breakdown voltage PMOSs (17), (22) and (24).

The sources of the drain high breakdown voltage PMOSs (17) and (22) are connected to the Vdd2.

The VIN terminal is connected to the other input of the AND (8) and the pair of input MOS transistor NMOSs (15)

and (16) receive, at their gates, the output of the AND (8) and the output of the inverter (9) respectively, the output of the inverter (9) being an inverted signal of the output of the AND (8). The sources of the NMOSs (15) and (16) are connected to the Vss1 and the drain of the NMOS (15) is connected to the drain of the PMOS (13). The drain of the NMOS (16) is connected to the drain of the PMOS (14). The gates of the PMOSs (13), (14) are interconnected to the drains of the PMOSs (14), (13) respectively.

The drain of the NMOS (16) is connected to the gates of the PMOS (18) and the NMOS (19), and the source of the NMOS (19) is connected to the Vss1. The drains of the PMOS (18) and NMOS (19) are connected to each other and their outputs are inputted to the gates of the PMOS (23) and NMOS (26).

The source of the NMOS (26) is connected to the Vss1 and its drain is connected to the drain of the PMOS (23) through the drain high breakdown voltage NMOS (25) and the drain high breakdown voltage PMOS (24).

With a view to ensuring the breakdown voltages of the elements by interposing drain high breakdown voltage MOS transistors in the shut-down state with the power supply turned OFF when the Vdd2 becomes higher, the sources of the PMOSs (13), (14), (18) are connected to the drain of the drain high breakdown voltage PMOS (17), the source of the PMOS (23) is connected to the drain of the drain high breakdown voltage PMOS (22), and the VOUT terminal is connected to the drains of the drain high breakdown voltage NMOS (25) and the drain high breakdown voltage PMOS (24).

In order to determine the drain and source voltages when the drain high breakdown voltage MOS transistors are in the OFF state, the drain of the NMOS (20) is connected to the drain of the drain high breakdown voltage PMOS (17), the drain of the NMOS (21) is connected to the gate of the NMOS (26), and the drain of the NMOS (27) is connected to the source of the drain high breakdown voltage NMOS (25).

In order to determine the drain and source voltages when the drain high breakdown voltage MOS transistors are in the OFF state and to output a constant voltage to the TOUT terminal when the first level shift element (1) of the first embodiment, to which the second embodiment is applied, is in the shut-down state with its power supply turned OFF, the drain of the NMOS (30) is connected to the Vdd2 through the resistors (29) and (28), the node at which the resistors (29) and (28) are interconnected is connected to the gate of the PMOS (31), the drain of the NMOS (34) is connected to the Vdd2 through the resistors (33), (32) and the PMOS (31), and the node at which the resistors (33) and (32) are interconnected is connected to the source of the drain high breakdown voltage PMOS (24) and the TOUT terminal.

The sources of the NMOSs (12), (20), (21), (27), (30) and (34) are connected to the Vss1.

The operation of the first level shift element (1) according to the second embodiment having the above configuration will be described below.

Figure 3A:
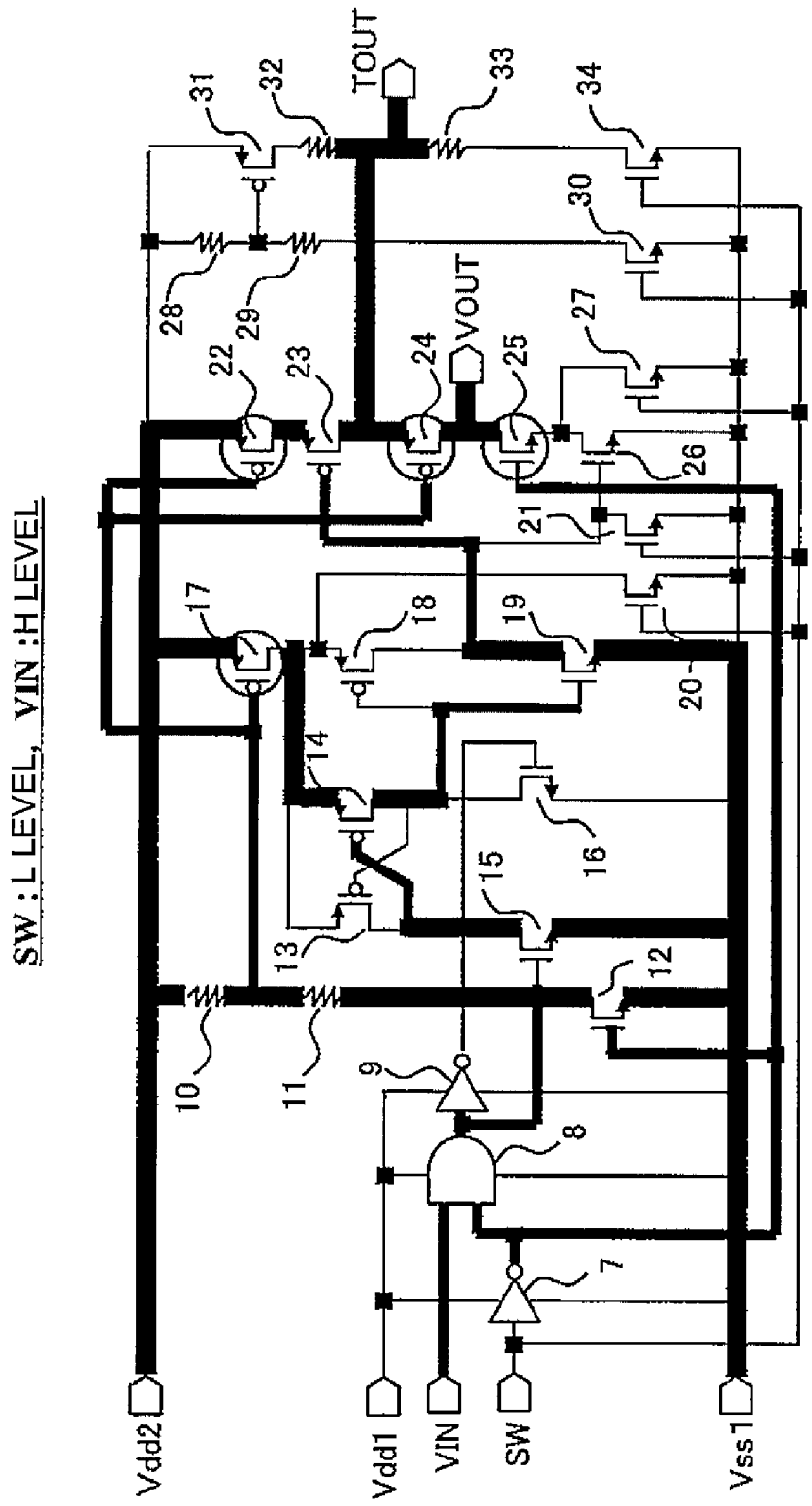
FIG. 3A is an explanatory diagram illustrating an operation of the level shift circuit shown in FIG. 2.
Figure 3B:
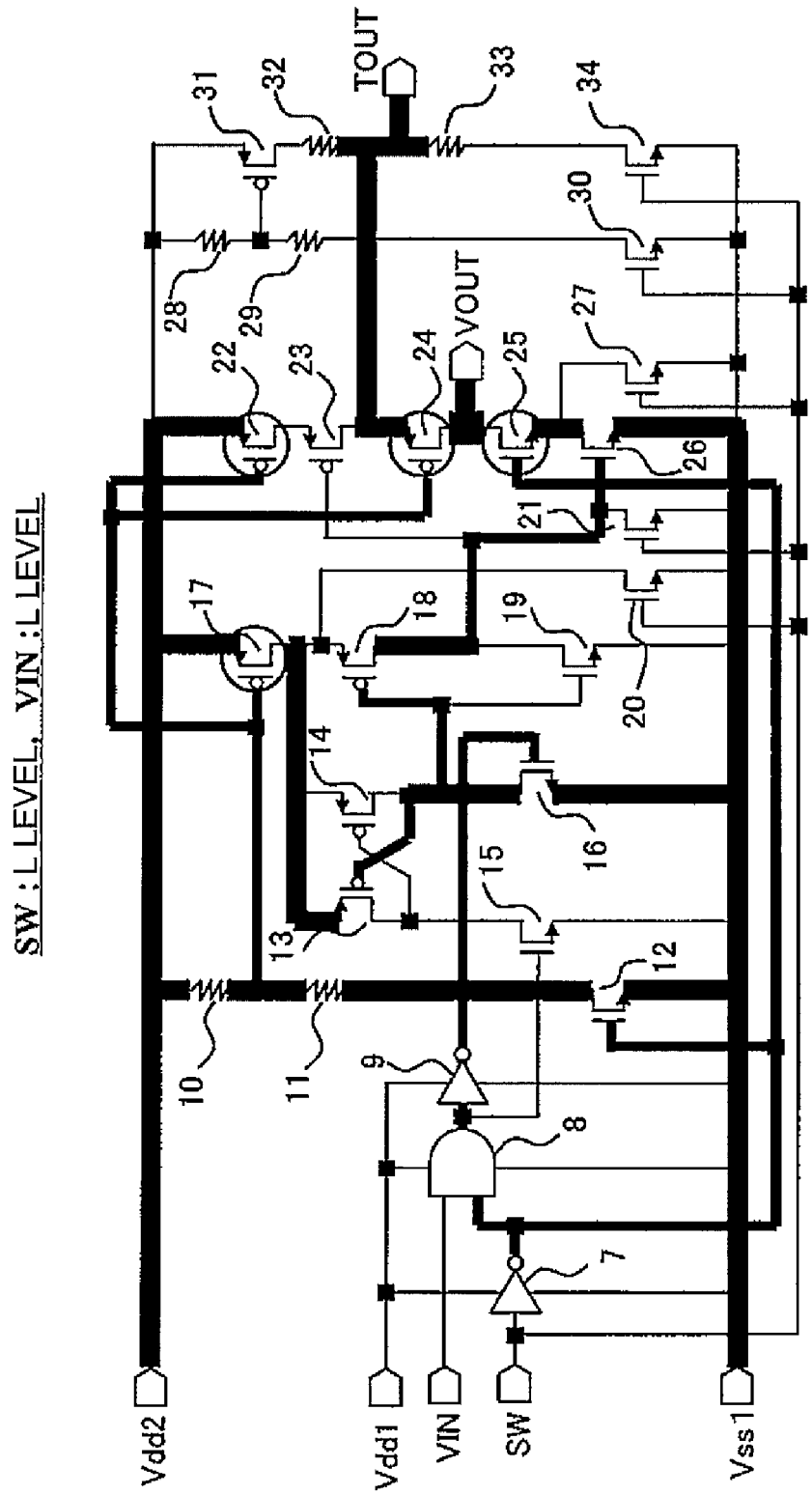
FIG. 3B is an explanatory diagram illustrating an operation of the level shift circuit shown in FIG. 2.

FIG. 3A is a diagram for explaining the state of the level shift circuit in which an L-level signal is inputted to the SW terminal and an H-level signal is inputted to the VIN terminal. FIG. 3B is a diagram for explaining the state of the level shift circuit in which an L-level signal is inputted to the SW terminal and an L-level signal is inputted to the VIN terminal. Heavy lines shown in FIGS. 3A and 3B represent a signal path which is asserted to an H level and a current path formed by turning the transistors ON.

When the first amplitude signal inputted to the SW terminal is at an L level, the NMOSs (20), (21), (27), (30), (34) are turned OFF, the NMOS (12) and the drain high breakdown voltage NMOS (25) are turned ON, and the drain high breakdown voltage PMOSs (17), (22), (24) are turned ON by the turning ON of the NMOS (12), so that the first level shift element (1) is brought into the operating state with its power supply turned ON.

The first amplitude signal, which has been input to the VIN terminal, is inputted to the gate of the NMOS (15) via the AND (8). The first amplitude signal, which has been input to the VIN terminal, also enters the gate of the NMOS (16) as an inverted signal via the AND (8) and the inverter (9). In accordance with the signal level of the input signal VIN, the NMOS (15) and the NMOS (16) are turned ON or OFF.

The NMOSs (15) and (16) are turned ON or OFF, thereby driving the load PMOSs (13) and (14) which are connected to the drains of the NMOSs (15) and (16) respectively, and their drain voltages are varied by the second amplitude generated by the supply voltage [Vdd2–Vss1]. The amplitude outputted to the drain of the NMOS (16) is outputted to the VOUT terminal and the TOUT terminal through an inverter that is constituted by the PMOS (18) and the NMOS (19) and an inverter that is constituted by the PMOS (23), the NMOS (26), the drain high breakdown voltage PMOS (24) and the drain high breakdown voltage NMOS (25).

There will be explained the voltage of the Vdd2 in the circuit of the second embodiment, which Vdd2 is operable when the circuit is in the operating state with the power supply turned ON.

The lower limit operating voltage of the Vdd2 is determined by the part that extends from the drain of the drain high breakdown voltage PMOS (17) to the Vss1 through the PMOSs (13), (14) and the NMOS (15), (16). This lower limit voltage is determined as represented by Equation (2) and is independent of the Vdd1 so that the Vdd2 is operable at a voltage lower than that of the Vdd1.

It should be noted that VDS (17) designates the drain to source voltage of the drain high breakdown voltage PMOS (17), VGS (13) designates the gate to source voltage of the PMOS (13), and VDS (16) designates the drain to source voltage of the NMOS (16).

The same lower limit operating voltage of the Vdd2 can be obtained even if VGS (13) is replaced with VGS (14) and VDS (16) is replaced with VDS (15) in Equation (2).

$$\text{Lower limit operating voltage of the } Vdd2 = VDS(17) + VGS(13) + VDS(16) \qquad (2)$$

Figure 4:
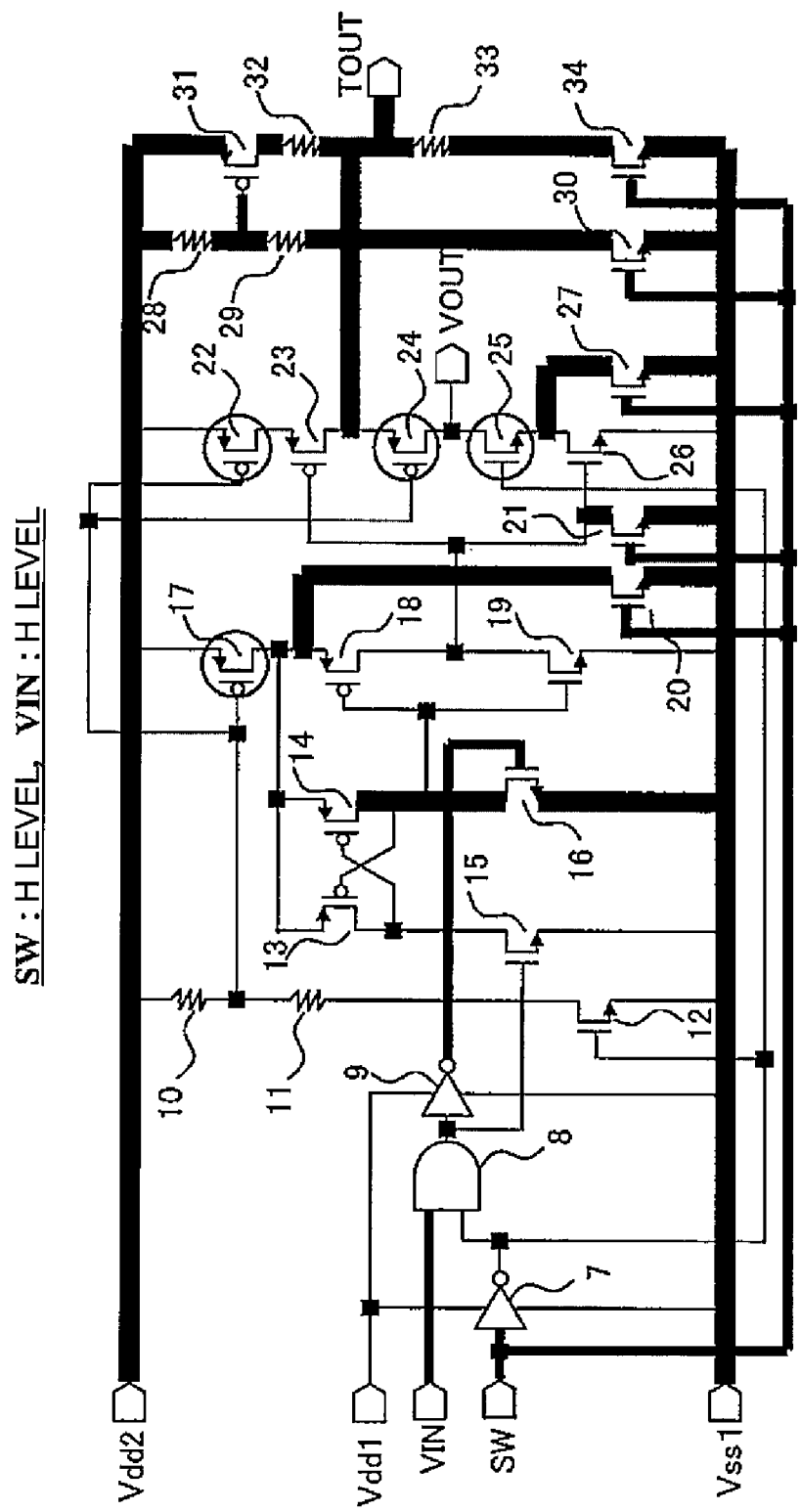
FIG. 4 is an explanatory diagram illustrating an operation of the level shift circuit shown in FIG. 2.

FIG. 4 is a diagram illustrating a state of the level shift circuit in which an H-level signal is inputted to the SW terminal and an H-level signal is inputted to the VIN terminal. Heavy lines shown in FIG. 4 represent a signal path asserted to an H level and a current path formed by turning the transistors ON.

When the first amplitude signal inputted to the SW terminal is at an H level, the circuit of the second embodiment comes into the shut-down state with its power supply turned OFF.

The NMOSs (20), (21), (27), (30), (34) are turned ON, the NMOS (12) and the drain high breakdown voltage NMOS (25) are turned OFF, and the drain high breakdown voltage PMOSs (17), (22), (24) are turned OFF by the turning OFF of the NMOS (12). In this condition, the voltage of the Vss1 is applied to the drain of the drain high breakdown voltage PMOS (17) through the NMOS (20) and a constant voltage is applied to the source of the drain high breakdown voltage PMOS (24) and outputted to the TOUT, which constant voltage has been generated by impedance division of the voltage of the Vdd2 between the NMOS (34), the resistor (33), the resistor (32) and the PMOS (31).

At that time, the drain high breakdown voltage PMOS (24) and the drain high breakdown voltage NMOS (25) are turned OFF and therefore, a signal is not released from the VOUT terminal to the TOUT terminal.

Reference is made to TABLE 1 to describe a condition in which the breakdown voltages are ensured when the circuit of the second embodiment is in the shut-down state with its power supply turned OFF.

The following explanation is made with the supply voltage [Vdd1−Vss1]=3V and the supply voltage [Vdd2−Vss1]=7V.

TABLE 1 shows, as one example, the breakdown voltages of the respective elements. In TABLE 1, VGS represents gate to source breakdown voltage, VGD represents gate to drain breakdown voltage and VDS represents drain to source voltage. All breakdown voltages except the VGD and VDS of the drain high breakdown voltage MOSs are 6V and the VGD and VDS of the drain high breakdown voltage MOSs are 15V.

Referring to FIG. 2, in the shut-down state with the power supply turned OFF, the voltage of the drain of the drain high breakdown voltage PMOS (17) is brought close to the voltage of the Vss1 through the NMOS (20), and therefore the voltage of the Vdd2=7V is not applied to the elements connected between the drain of the drain high breakdown voltage PMOS (17) and the Vss1. Although the voltage [Vdd2−Vss1]=7V is applied to the VDS of the drain high breakdown voltage PMOS (17), the breakdown voltage of the VDS is ensured because it is 15'V.

A voltage close to the voltage of the Vss1 is applied to the source of the drain high breakdown voltage NMOS (25) through the NMOS (27) and a constant voltage, generated by impedance division of the voltage of the Vdd2 between the NMOS (34), the resistor (33), the resistor (32) and the PMOS (31), is applied to the drain of the drain high breakdown voltage PMOS (22) by the PMOS (23) entering the unsaturated region.

Even if the output of the second level shift element (2) causes the VOUT terminal to oscillate with the second amplitude generated by the supply voltage [Vdd2−Vss1]=7V, the drain high breakdown voltage PMOS (24) and the drain high breakdown voltage NMOS (25) are kept in the OFF state by adjusting the resistors (33) and (32) so as to keep the constant voltage TOUT=5V, so that the breakdown voltages of the respective elements shown in TABLE 1 are not exceeded but ensured.

When the first level shift element (1) is in the operating state with its power supply turned ON, the TOUT terminal, which is for outputting an ON/OFF determination signal, outputs an amplitude generated at the drain of the NMOS (16) via the inverter constituted by the PMOS (18) and NMOS (19) and via the inverter constituted by the PMOS (23), NMOS (26), drain high breakdown voltage PMOS (24), and drain high breakdown voltage NMOS (25). On the other hand, when the first level shift element (1) is in the shut-down state with its power supply turned OFF, a constant voltage generated by impedance division of the voltage of the Vdd2 between the NMOS (34), resistor (33), resistor (32) and PMOS (31) is applied and the drain high breakdown voltage PMOS (24) and the drain high breakdown voltage NMOS (25) are turned OFF. Therefore, even if the VOUT terminal is oscillated with the second amplitude, the constant voltage unaffected by amplitude can be output. This enables it to easily determine whether the first level shift element (1) is in its operating state or shut-down state by determining whether a signal oscillating with the second amplitude is outputted (i.e., the operating state with the power supply turned ON) or a constant voltage unaffected by amplitude is outputted (i.e., the shut-down state with the power supply turned OFF).

The above configuration has such an effect that when the power supply for the first level shift element (1) of the second embodiment is ON, the Vdd2 can start operation from a low voltage and when it is OFF, the breakdown voltages of the elements can be ensured even if the Vdd2 has high voltage. The above configuration also has the effect of easily determining the operating/shut-down state of the first level shift element (1) when its power supply is turned ON or OFF in response to an input signal received through the SW terminal.

[Third Embodiment]

Figure 5:
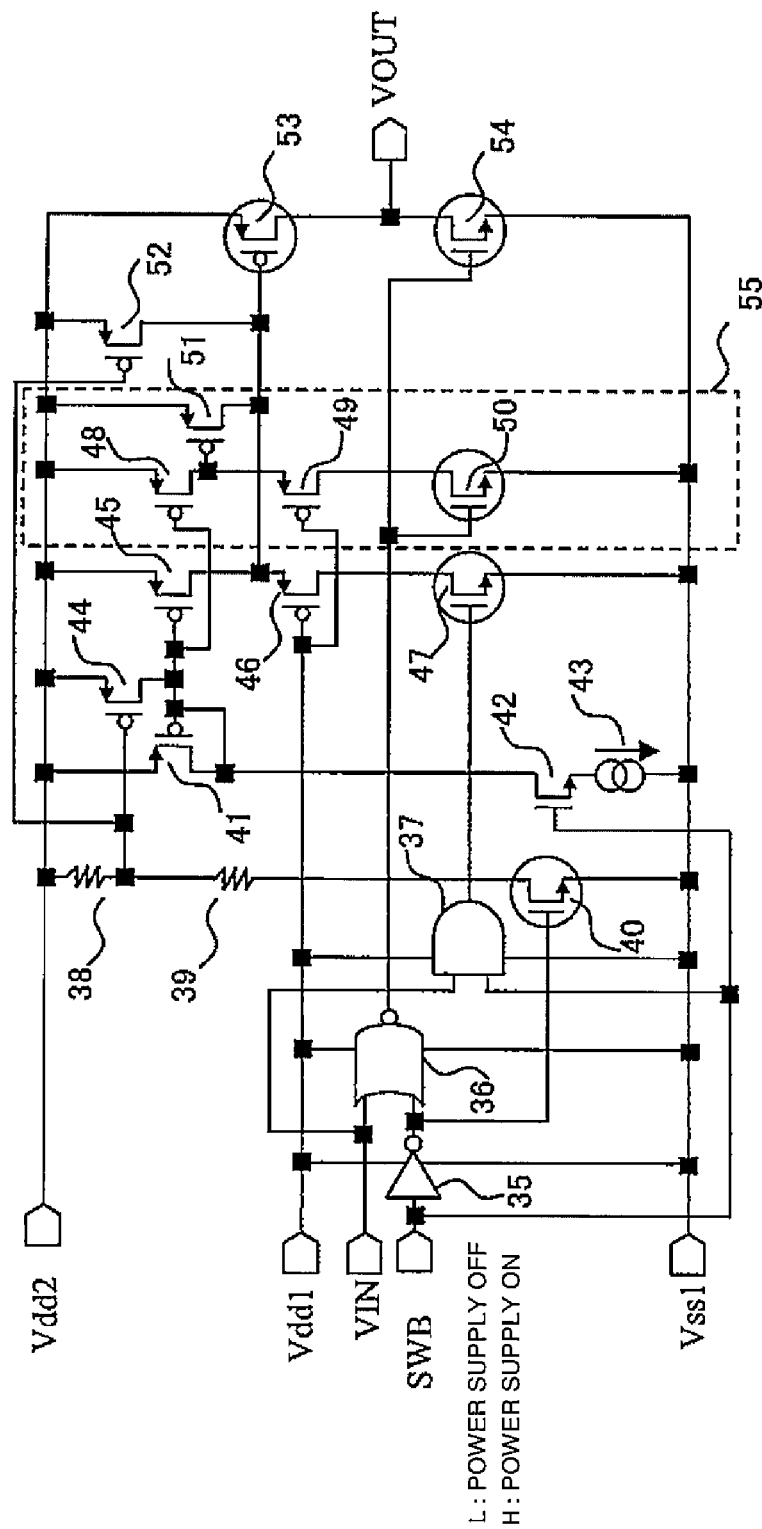
FIG. 5 is a configuration diagram of third and fifth embodiments.

FIG. 5 shows the configuration of the level shift circuit according to the third embodiment, which is a concrete configuration suitably applicable to the second level shift element (2) of the first embodiment.

In FIG. 5, numeral 35 designates an inverter; numeral 36 designates a NOR; numeral 37 designates an AND; numerals 38 and 39 each designate a resistor; numerals 41, 44, 45, 46, 48, 49, 51, 52 designate a PMOS; numeral 42 designates an NMOS; numeral 53 designates a drain high breakdown resistance PMOS; numerals 40, 47, 50, 54 designate a drain high breakdown voltage NMOS; numeral 43 designates a current source; numeral 55 designates a current feed capacity UP switching element; Vdd1 designates a first high potential side power supply; Vdd2 designates a second high potential side power supply; Vss1 designates a low potential side power supply; SWB designates a power supply OFF/ON switching element; VIN designates a signal input terminal; and VOUT designates a signal output terminal.

The power supply terminals of the inverter (35), NOR (36) and AND (37) are connected to the Vdd1 and their earth terminals are connected to the Vss1.

The VIN terminal is connected to one of the inputs of the NOR (36) and one of the inputs of the AND (37). The output of the NOR (36) is inputted to the gates of the drain high breakdown voltage NMOSs (50) and (54), and the output of the AND (37) is connected to the gate of the drain high breakdown voltage NMOS (47).

The sources of the drain high breakdown voltage NMOSs (47), (50) and (54) are connected to the Vss1.

The source of the drain high breakdown voltage PMOS (53) is connected to the Vdd2 and its drain is connected to the drain of the drain high breakdown voltage NMOS (54) and the VOUT terminal.

In the configuration in which the lower limit gate voltage of the drain high breakdown voltage PMOS (53) is limited to Equation (3), the drain of the drain high breakdown voltage NMOS (47) is connected to the Vdd2 via the PMOSs (46), (45), and the source of the PMOS (46) is connected to the gate of the drain high breakdown voltage PMOS (53), the drain of the PMOS (51) and the drain of the PMOS (52) whereas its gate is connected to the Vdd1. In Equation (3), VGS (46) represents the gate to source voltage of the PMOS (46).

Lower limit gate voltage of drain high breakdown voltage PMOS (53)=

$$Vdd1 + VGS(46) \tag{3}$$

The configuration of the current feed capacity UP switching element (55) is such that the source of the PMOS (51) is connected to the Vdd2; the drain of the drain high breakdown voltage NMOS (50) is connected to the Vdd2 via the PMOSs (49) and (48); the source of the PMOS (49) is connected to the gate of the PMOS (51); and the gate of the PMOS (49) is connected to the Vdd1.

This current feed capacity UP switching element (55) is configured to limit the lower limit gate voltage of the PMOS (51) to Equation (4) so that the breakdown voltages of the elements can be ensured even if the voltage of the Vdd2 is high and high speed operation with low electric current consumption can be realized.

In Equation (4), VGS (49) represents the gate to source voltage of the PMOS (49).

Lower limit gate voltage of $PMOS(51) = Vdd1 + VGS\ (49)$ (4)

The SWB terminal is connected to the other input of the AND (37), the input of the inverter (35) and the gate of the NMOS (42), and the output of the inverter (35) is connected to the other input of the NOR (36) and the gate of the drain high breakdown voltage NMOS (40).

The source of the NMOS (42) is connected to the Vss1 via the current source (43) whereas its drain is connected to the Vdd2 via the PMOS (41). The drain and gate of the PMOS (41) are connected to the gate of the PMOS (45) and the gate of the PMOS (48), forming a current mirror circuit, and the gate of the PMOS (41) is also connected to the drain of the PMOS (44).

The source of the drain high breakdown voltage NMOS (40) is connected to the Vss1 and its drain is connected to the Vdd2 via the resistors (39), (38). The node at which the resistors (39) and (38) are interconnected is connected to the gates of the PMOSs (44) and (52), and the sources of the PMOSs (44) and (52) are connected to the Vdd2.

The above-described connections make it possible to perform high-speed operation with low electric current consumption in a circuit equipped with the current feed capacity UP switching element (55) having the function of switching current feed capacity and to ensure the breakdown voltages of the elements (including the current feed capacity UP switching element (55)) used in the circuit.

The operation of the level shift circuit having the above configuration according to the third embodiment will be described.

Figure 7:
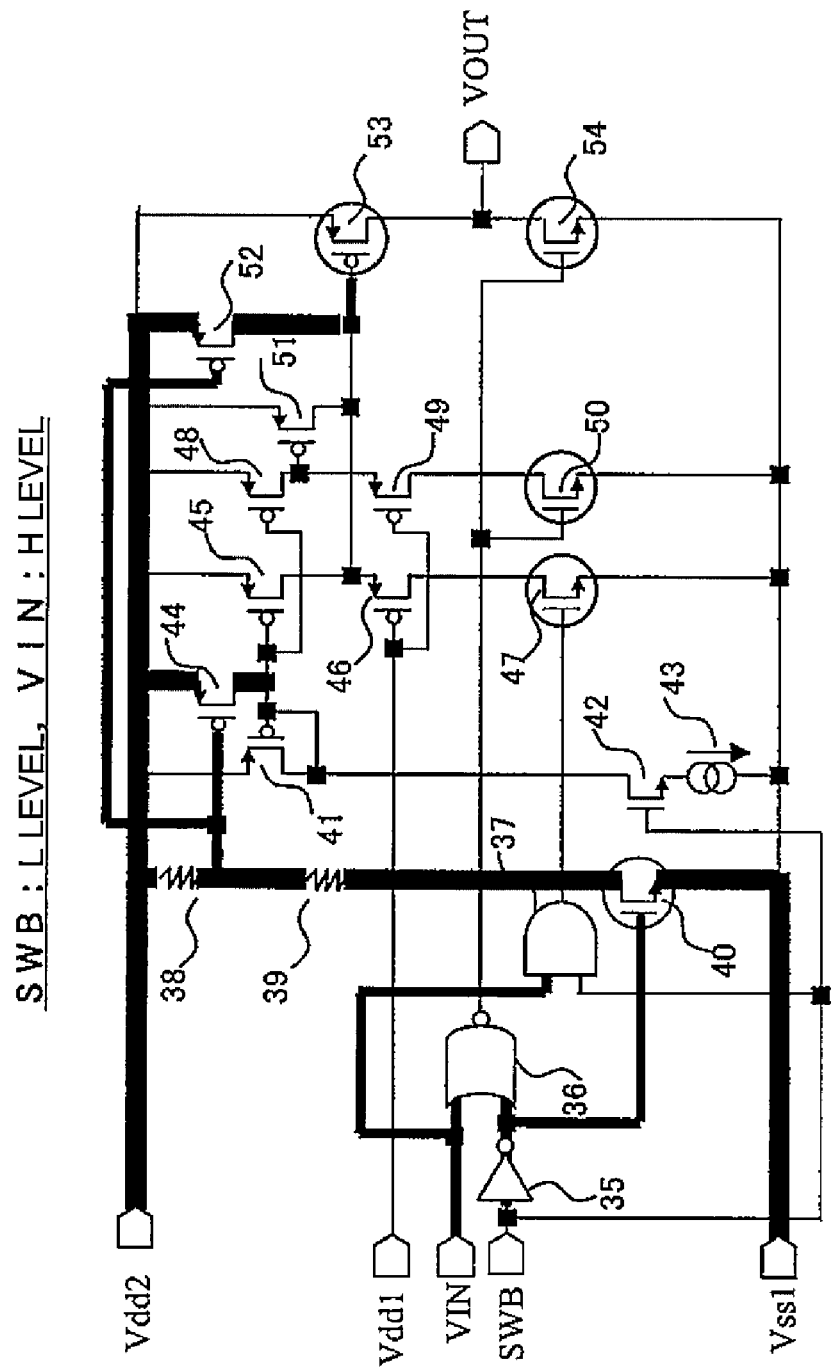
FIG. 7 is an explanatory diagram illustrating an operation of the level shift circuit shown in FIG. 5.

FIG. 7 is a diagram illustrating a state of the level shift circuit in which an L-level signal is inputted to the SWB terminal and an H-level signal is inputted to the VIN terminal. Heavy lines shown in FIG. 7 represent a signal path asserted to an H level and a current path formed by turning the transistors ON.

When a first amplitude input signal of an L level is inputted to the SWB terminal, the input signal being generated by the supply voltage [Vdd1–Vss1], the NMOS (42) is turned OFF and the current from the current source (43) is shut off. The signal of the SWB inverted by the inverter (35) is inputted to the gate of the drain high breakdown voltage NMOS (40) so that the drain high breakdown voltage NMOS (40) is turned ON, and the voltage produced by dividing the voltage of the Vdd2 between the resistors (38) and (39) is applied to the gates of the PMOSs (44) and (52) to turn the PMOSs (44), (52) ON so that the drain high breakdown voltage PMOS (53) is turned OFF.

The L-level signal input by the SWB is inputted to the gates of the drain high breakdown voltage NMOSs (50) and (54) via the inverter (35) and the NOR (36) so that the NMOSs (50) and (54) are turned OFF and is inputted to the gate of the drain high breakdown voltage NMOS (47) via the AND (37) so that the NMOS (47) is turned OFF, whereby the power supply for the circuit of the third embodiment is turned OFF, bringing the circuit into the shut-down state.

Figure 8A:
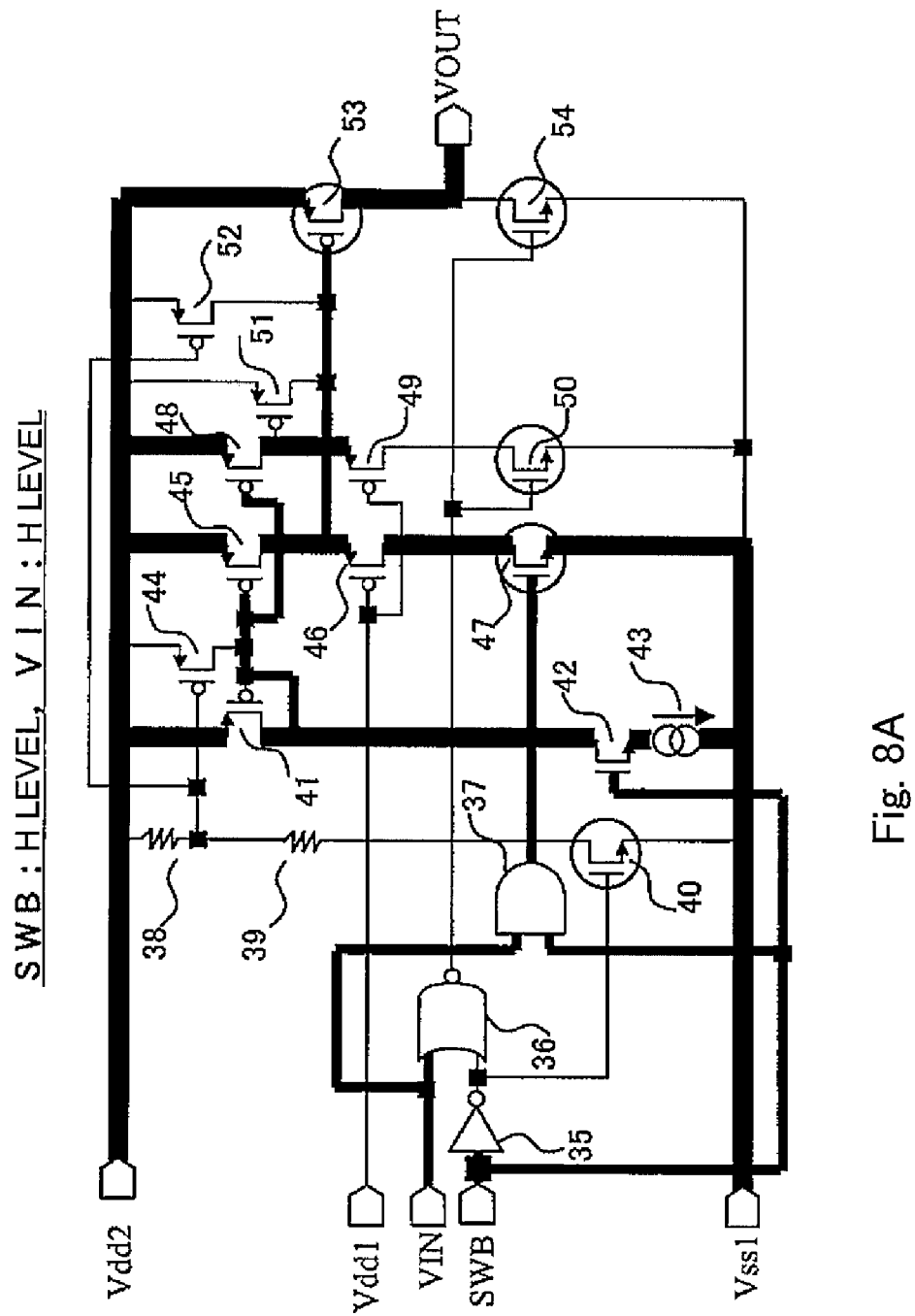
FIG. 8A is an explanatory diagram illustrating an operation of the level shift circuit shown in FIG. 5.
Figure 8B:
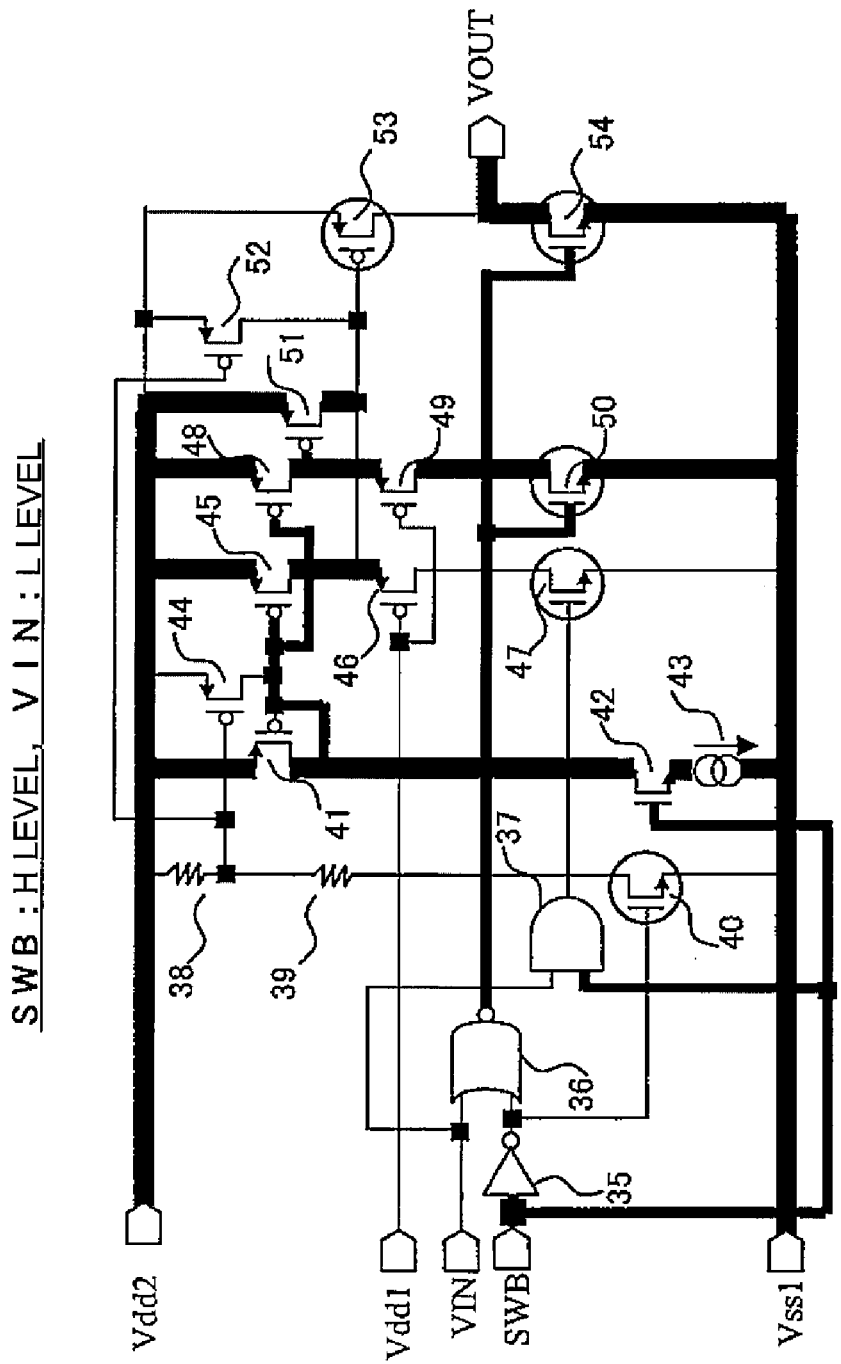
FIG. 8B is an explanatory diagram illustrating an operation of the level shift circuit shown in FIG. 5.

FIG. 8A is a diagram illustrating a state of the level shift circuit in which an H-level signal is inputted to the SWB terminal and an H-level signal is inputted to the VIN terminal. FIG. 8B is a diagram illustrating a state of the level shift circuit in which an H-level signal is inputted to the SWB terminal and an L-level signal is inputted to the VIN terminal. Heavy lines shown in FIGS. 8A and 8B represent a signal path which is asserted to an H level and a current path formed by turning the transistors ON.

When a first amplitude input signal of an H-level is inputted to the SWB terminal, the NMOS (42) is ON, the output current of the current source (43) is supplied to the PMOS (41), and a signal inverted by the inverter (35) is inputted to the gate of the drain high breakdown voltage NMOS (40), turning the NMOS (40) OFF, so that the PMOSs (44), (52) are turned OFF, turning the power supply for the circuit of the third embodiment ON to bring the circuit into the operating state.

The PMOSs (41), (45), (48) constitute a current mirror circuit and the output current of the current source (43) is inputted to the connected gate and drain of the PMOS (41) by the turning ON of the NMOS (42). Then, the PMOSs (45), (48) output a current in accordance with the transistor size ratio between the PMOS (41) and the PMOSs (45), (48).

The first amplitude signal, which has entered the VIN terminal, is inputted to the gates of the drain high breakdown voltage NMOSs (50) an (54) as an inverted signal through the NOR (36). The first amplitude signal, which has entered the VIN terminal, is also inputted to the gate of the drain high breakdown voltage NMOS (47) through the AND (37). In accordance with the signal level of the input signal VIN, the drain high breakdown voltage NMOS (47) is turned ON or OFF. In response to the inverted signal, the drain high breakdown voltage NMOSs (50) and (54) are turned ON or OFF.

When the input signal VIN is at an H level, the drain high breakdown voltage NMOSs (54) and (50) are turned OFF upon receipt of the inverted signal sent from the NOR (36) so that the electric current flowing in the PMOS (49) is shut off. Then, the PMOS (48) enters the unsaturated region while charging the node connected to the gate of the PMOS (51) with its output current, so that the gate voltage value of the PMOS (51) is brought close to the voltage of the Vdd2 to turn the PMOS (51) OFF. Upon receipt of the signal through the AND (37), the drain high breakdown voltage NMOS (47) is turned ON so that the electric current outputted from the PMOS (45) is allowed to flow into the PMOS (46). The drain high breakdown voltage PMOS (53) is turned ON with its gate being clamped to the voltage represented by Equation (3), so that the voltage close to the Vdd2 is outputted to the VOUT terminal.

When the input signal VIN is at an L level, the drain high breakdown voltage NMOS (47) is turned OFF so that the electric current flowing in the PMOS (46) is shut off. The PMOS (45) enters the unsaturated region while charging the node connected to the gate of the drain high breakdown voltage PMOS (53) with its output current, so that the gate voltage of the drain high breakdown voltage PMOS (53) becomes close to the voltage of the Vdd2 to turn the PMOS (53) OFF.

Further, while the current feed capacity UP switching element (55) is in operation, the drain high breakdown voltage NMOS (50) is turned ON so that the electric current outputted from the PMOS (48) is allowed to flow into the PMOS (49). The PMOS (51) is turned ON with its gate voltage being clamped to the voltage represented by Equation (4). The capacity of feeding current to the gate of the drain high breakdown voltage PMOS (53) is increased to accelerate the speed at which the gate voltage of the drain high breakdown voltage PMOS (53) becomes close to the voltage of the Vdd2 and the PMOS (53) is turned OFF.

At that time, the drain high breakdown voltage NMOS (54) is turned ON so that a voltage close to the Vss1 is outputted to the VOUT terminal.

The effect of the current feed capacity UP switching element (55) will be described in details. The current feed capacity UP switching element (55) is for increasing the fall speed of the VOUT output that falls from an H level to an L level when the input signal VIN changes from an H level to an L level.

Figure 6:
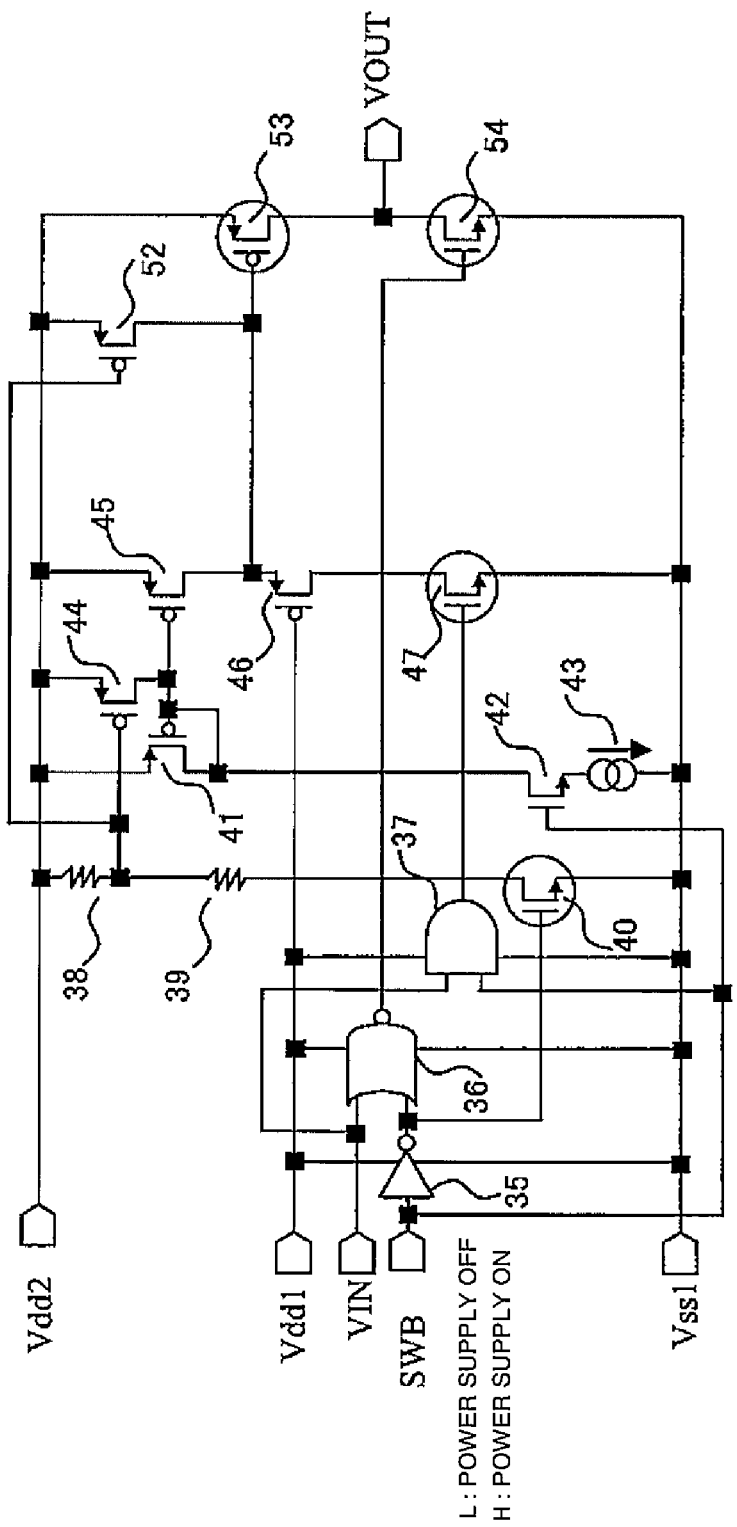
FIG. 6 is a configuration diagram showing the configuration of FIG. 5 from which a current feed capacity UP switching element (55) is eliminated.

FIG. 6 is a circuit diagram which shows, for comparison purpose, a circuit obtained by eliminating the current feed capacity UP switching element (55) from FIG. 5. FIG. 6 does not differ from FIG. 5 in terms of the reference numerals, connections and operations of the respective parts except that FIG. 6 does not have the current feed capacity UP switching element (55), and therefore a detailed explanation is skipped.

FIG. 6 shows a configuration in which the PMOS (45) constituting the current mirror circuit enters the unsaturated region, while charging the node with its output current which node is connected to the gate of the drain high breakdown voltage PMOS (53) that is an output transistor, so that the gate voltage of the PMOS (53) becomes close to the voltage value of the Vdd2. This operation shown in FIG. 6 is the same as of the known level shift circuit shown in FIG. 12 in which the PMOS (69) of the current mirror circuit charges the input of the inverter (73) with the current outputted therefrom so that the output of the inverter (73) becomes close to the value of the Vdd2.

Figure 12:
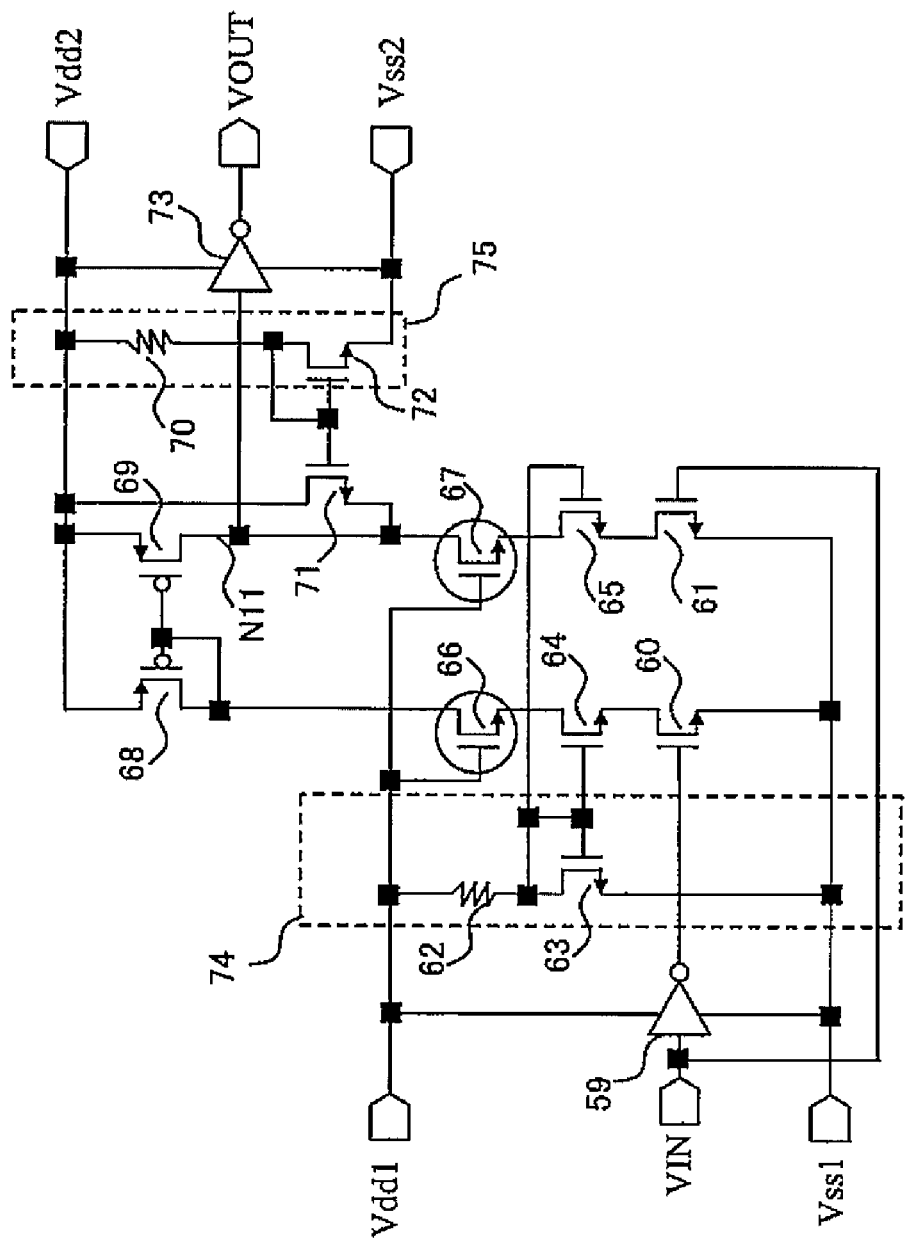
FIG. 12 shows a known level shift circuit disclosed in FIG. 1 in Page 10 of JP-A-2004-72829.
Figure 13:
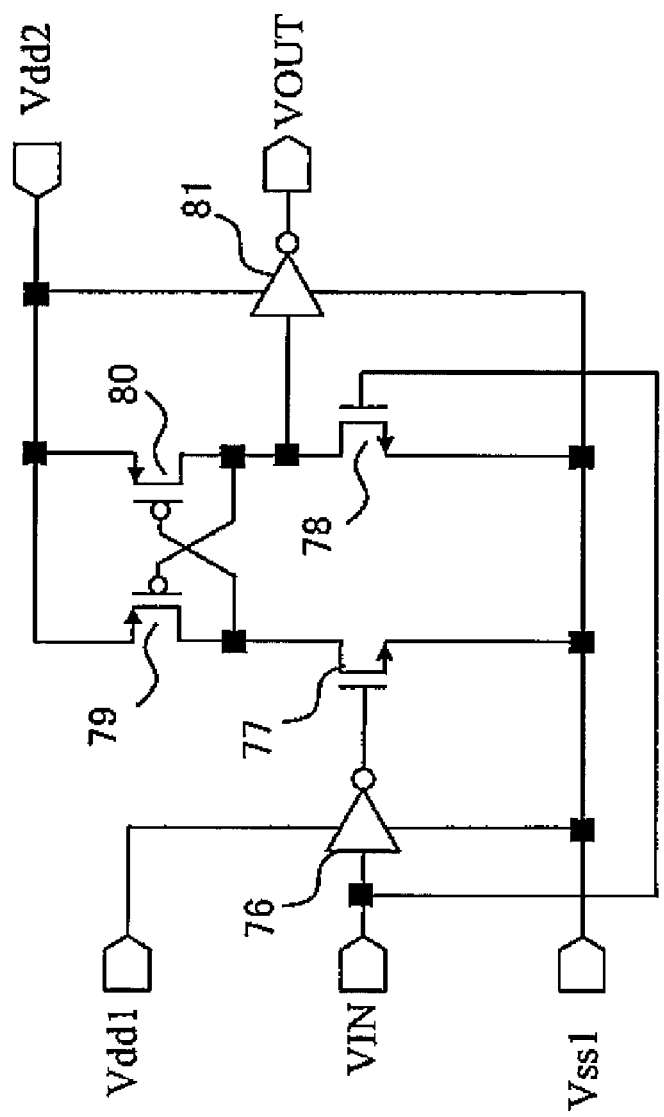
FIG. 13 shows a known level shift circuit cited in FIG. 6 in Page 11 of JP-A-2104-72829.

Regarding the fall time of the VOUT signal, the fall time shown in FIG. 6 is equal to that of FIG. 12 on condition that the PMOS (45) shown in FIG. 6 and the PMOS (69) shown in FIG. 12 have the same output current value and the same load value.

TABLE 2 shows simulation results obtained in the measurements of the fall time of the VOUT signal, using the circuits of FIGS. 5 and 6.

TABLE 2

Simulation Results of FIGS. 5 and 6

| SIM No. | 1 | 2 | 3 |
|---|---|---|---|
| reference diagram | FIG. 5 | FIG. 6 | FIG. 6 |
| current (43) [multiples] | ×1 | ×1 | ×15 |
| fall time [nsec.] | 7.3 | 106.3 | 7.6 |
| notes: | No increase in current with the shortest fall time. | Fall time is extended. | 15-fold current is required to reduce fall time. |

Figure 11:
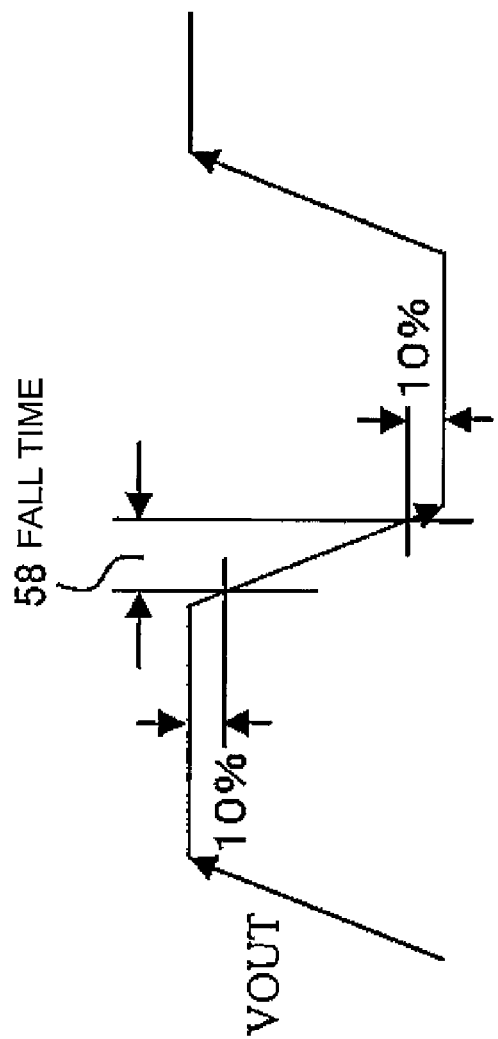
FIG. 11 is a VOUT output waveform chart of the level shift circuits shown in FIGS. 5 and 6.

FIG. 11 is a diagram showing a region of the VOUT signal which was measured as the fall time in TABLE 2. In FIG. 11, numeral 58 designates the fall time, i.e., the time taken for the VOUT signal to fall from the voltage that is 10% lower than the high potential peak to the voltage that is 10% higher than the low potential peak.

TABLE 3 shows the conditions for the simulations the results of which are shown in TABLE 2. The conditions are such that Vdd1=3.0V, Vdd2=7.0V, temperature=27° C., VIN amplitude=3.0Vpp and SWB=3.0V.

TABLE 3

Simulation Conditions for FIGS. 5 and 6

| items | unit | value |
|---|---|---|
| Vdd1 | V | 3.0 |
| Vdd2 | V | 7.0 |

TABLE 3-continued

Simulation Conditions for FIGS. 5 and 6

| items | unit | value |
|---|---|---|
| temperature | ° C. | 27 |
| VIN amplitude | Vpp | 3.0 |
| SWB | V | 3.0 |

TABLE 4 shows resistance values associated with FIGS. 5 and 6, the resistance values being employed in the simulations the results of which are shown in TABLE 2. The resistor (38) is 250 kΩ and the resistor (39) is 25 kΩ.

TABLE 4

Resistance Values for FIGS. 5 and 6

| R No. | resistance value [Ω] |
|---|---|
| resistor (38) | 250k |
| resistor (39) | 25k |

TABLE 5 shows transistor sizes associated with FIGS. 5 and 6 and employed in the simulations the results of which are shown in TABLE 2.

TABLE 5

Sizes of Transistors in FIGS. 5 and 6

| Tr No. | L value [μm] | W value [μm] |
|---|---|---|
| drain high breakdown voltage NMOS (40) | 0.25 | 19.6 |
| PMOS (41) | 1.5 | 12.5 |
| NMOS (42) | 1.5 | 12.5 |
| PMOS (44) | 0.6 | 0.9 |
| PMOS (45) | 1.5 | 12.5 |
| PMOS (46) | 1.5 | 25 |
| drain high breakdown voltage NMOS (47) | 0.25 | 19.6 |
| PMOS (48) | 1.5 | 12.5 |
| PMOS (49) | 1.5 | 25 |
| drain high breakdown voltage NMOS (50) | 0.25 | 19.6 |
| PMOS (52) | 0.6 | 0.9 |
| drain high breakdown voltage PMOS (53) | 1.6 | 240 |
| drain high breakdown voltage NMOS (54) | 0.25 | 78.4 |

Drain high breakdown voltage NMOS (40): L = 0.25 μm, W = 19.6 μm
PMOS (41): L = 1.5 μm, W = 12.5 μm
NMOS (42): L = 1.5 μm, W = 12.5 μm
PMOS (44): L = 0.6 μm, W = 0.9 μm
PMOS (45): L = 1.5 μm, W = 12.5 μm
PMOS (46): L = 1.5 μm, W = 25 μm
Drain high breakdown voltage NMOS (47): L = 0.25 μm, W = 19.6 μm
PMOS (48): L = 1.5 μm, W = 12.5 μm
PMOS (49): L = 1.5 μm, W = 25 μm
Drain high breakdown voltage NMOS (50): L = 0.25 μm, W = 19.6 μm
PMOS (52): L = 0.6 μm, W = 0.9 μm
Drain high breakdown voltage PMOS (53): L = 1.6 μm, W = 240 μm
Drain high breakdown voltage NMOS (54): L = 0.25 μm, W = 78.4 μm It is understood from TABLE 2 that the fall time of the level shift circuit of the third embodiment shown in FIG. 5 (SIM No. 1) is 7.3 nsec. that is the shortest fall time. The fall time of the circuit shown in FIG. 6 (SIM No. 2), which circuit is obtained by eliminating the current feed capacity UP switching element (55) from the circuit of FIG. 5, is 106.3 nsec. that is 14.6 times that of the circuit shown in FIG. 5. SIM No. 3 represents the result of a simulation conducted on the circuit of FIG. 6. In SIM No. 3, the current of the current source (43) is set to a value 15 times higher than in SIM No. 1. In terms of the fall time, SIM No. 3 (7.6 nsec.) is inferior to the level shift circuit of the third embodiment shown in FIG. 5, but the difference between them is only 0.3 nsec. However, SIM NO.

3 requires electric current 15 times higher than the level shift circuit of the third embodiment shown in FIG. 5. It is understood from this that the level shift circuit of the third embodiment shown in FIG. 5 is capable of performing high speed operation with low electric current consumption thanks to the effect of the current feed capacity UP switching element (55).

Reference is made to TABLE 1 to describe the state in which the breakdown voltages are ensured when the level shift circuit of the third embodiment shown in FIG. 5 is in the operating state with its power supply turned ON.

The following explanation is made under the condition that supply voltage [Vdd1−Vss1]=3V and supply voltage [Vdd2−Vss1]=7V.

TABLE 1 shows, as one example, the breakdown voltages of the respective elements.

First, the state of the current feed capacity UP switching element (55) will be explained.

When the input signal VIN is at an H level, the drain high breakdown voltage NMOS (50) is turned OFF, thereby shutting off the electric current flowing in the PMOS (49). The PMOS (48) enters the unsaturated region while charging the node with its output current, the node being connected to the gate of the PMOS (51), so that the drain voltage of the drain high breakdown voltage NMOS (50) is brought close to the voltage of the Vdd2 through the PMOS (49). Although a voltage close to [Vdd2−Vss1]=7V is applied as the drain to source voltage VDS of the drain high breakdown voltage NMOS (50), the VDS breakdown voltage of the drain high breakdown voltage NMOS (50) is maintained because it is 15V.

When the input signal VIN is at an L level, the drain high breakdown voltage NMOS (50) is turned ON to allow the current outputted from the PMOS (48) to flow into the PMOS (49), so that the gate of the PMOS (51) is clamped to the voltage represented by Equation (4). Accordingly, the potential difference [Vdd2−Vss1]=7V is not applied as the gate to source voltage VGS and therefore the breakdown voltage is ensured.

As has been described above, the current feed capacity UP switching element (55) fulfills the function that switches the capacity for feeding electric current to the node connected to the gate of the drain high breakdown voltage PMOS (53), while ensuring the breakdown voltage. Therefore, the current feed capacity UP switching element (55) is an element for performing high-breakdown-voltage and high-speed operation with low electric current consumption.

Next, the states of other elements than the current feed capacity UP switching element (55) when ensuring breakdown voltage will be described.

When the input signal VIN is at an H level, the drain high breakdown voltage NMOS (47) is turned ON, thereby allowing the electric current outputted form the PMOS (45) to flow into the PMOS (46), so that the gate of the drain high breakdown voltage PMOS (53) is clamped to the voltage represented by Equation (3). Accordingly, the potential difference [Vdd2−Vss1]=7V is not applied as the gate to source voltage VGS and therefore the breakdown voltage is ensured.

Although a voltage close to the voltage of the Vdd2 is outputted to the VOUT terminal, the VDS breakdown voltage of the drain high breakdown voltage NMOS (54) is ensured because it is 15V.

When the input signal VIN is at an L level, the drain high breakdown voltage NMOS (47) is turned OFF, thereby shutting off the electric current flowing in the PMOS (46) and the PMOS (45) enters the unsaturated region while charging the node, which is connected to the gate of the drain high breakdown voltage PMOS (53), with its output current so that the drain of the drain high breakdown voltage NMOS (47) is brought close to the voltage of the Vdd2 through the PMOS (46). Although a potential difference close to [Vdd2−Vss1]=7V is applied as the drain to source voltage VDS of the drain high breakdown voltage NMOS (47), the VDS breakdown voltage of the drain high breakdown voltage NMOS (47) is ensured because it is 15V.

Further, the drain high breakdown voltage NMOS (54) is turned ON, so that a voltage close to the voltage of the Vss1 is outputted to the VOUT terminal. However, the VDS breakdown voltage of the drain high breakdown voltage PMOS (53) is ensured because it is 15V.

When the SWB is at an H level, the drain high breakdown voltage NMOS (40) is in the OFF state and the drain has a voltage close to the voltage of the Vdd2. At that time, a potential difference close to [Vdd2−Vss1]=7V is applied as the drain to source voltage VDS of the drain high breakdown voltage NMOS (40). However, the VDS breakdown voltage of the drain high breakdown voltage NMOS (40) is ensured because it is 15V.

As has been described above, the level shift circuit of the third embodiment shown in FIG. 5 has such a superior effect that when it is in the operating state with its power supply turned ON, the breakdown voltages of the elements are ensured even if the Vdd2 has high voltage, so that high-breakdown-voltage, high-speed operation can be performed with low electric current consumption.

[Forth Embodiment]

FIG. 2 shows a configuration of a level shift circuit according to a fourth embodiment and also shows a configuration which uses this level shift circuit alone.

Whereas the fourth embodiment may be applicable as the first level shift element (1) employed in the level shift circuit of the first embodiment, it is suitably used alone as a level shift circuit that is operable when the voltage of the Vdd2 is low and is shut down for ensuring the breakdown voltages when the voltage of the Vdd2 becomes high.

The fourth embodiment has the same configuration and operation as of the second embodiment and therefore an explanation thereof is omitted herein.

The level shift circuit of the fourth embodiment has such an effect that when its power supply is ON, the Vdd2 starts up from low voltage and when its power supply is OFF, the breakdown voltages of the elements can be ensured even if the Vdd2 has a high voltage. Another effect is such that when the ON/OFF of the power supply is switched in response to a signal inputted to the SW terminal, it can be easily determined whether the level shift circuit is in the operating state or shut-down state.

[Fifth Embodiment]

FIG. 5 shows a configuration of a level shift circuit according to a fifth embodiment and also shows a configuration which uses this level shift circuit alone.

Whereas the fifth embodiment may be applicable as the second level shift element (2) employed in the level shift circuit of the first embodiment, it is suitably used alone as a level shift circuit that performs a high-speed operation with low electric current consumption, while ensuring the breakdown voltages of the elements when the voltage of the Vdd2 becomes high.

The fifth embodiment has the same configuration and operation as of the third embodiment and therefore an explanation thereof is omitted herein.

The level shift circuit of the fifth embodiment has such a superior effect that the breakdown voltages of the elements can be ensured even when the voltage of the Vdd2 is high, and high-breakdown-voltage and high-speed operation can be performed with low electric current consumption.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

The level shift circuit of the invention is useful as a constituent element of a semiconductor device employed in switching regulators because it is capable of providing low voltage operation, high breakdown voltage, low electric current consumption, improved operational frequency, and easy inspection.

| Reference Signs List (1) | |
|---|---|
| 1: | first level shift element |
| 2: | second level shift element |
| 3: | comparator circuit |
| 4: | resistor |
| 5: | resistor |
| 6: | reference voltage supply |
| 7: | inverter |
| 8: | AND |
| 9: | inverter |
| 10: | resistor |
| 11: | resistor |
| 12: | NMOS |
| 13: | PMOS |
| 14: | PMOS |
| 15: | NMOS |
| 16: | NMOS |
| 17: | drain high breakdown voltage PMOS |
| 18: | PMOS |
| 19: | NMOS |
| 20: | NMOS |
| 21: | NMOS |
| 22: | drain high breakdown voltage PMOS |
| 23: | PMOS |
| 24: | drain high breakdown voltage PMOS |
| 25: | drain high breakdown voltage NMOS |
| 26: | NMOS |
| 27: | NMOS |

| Reference Signs List (2) | |
|---|---|
| 28: | resistor |
| 29: | resistor |
| 30: | NMOS |
| 31: | PMOS |
| 32: | resistor |
| 33: | resistor |
| 34: | NMOS |
| 35: | inverter |
| 36: | NOR |
| 37: | AND |
| 38: | resistor |
| 39: | resistor |
| 40: | drain high breakdown voltage NMOS |
| 41: | PMOS |
| 42: | NMOS |
| 43: | current source |
| 44: | PMOS |
| 45: | PMOS |
| 46: | PMOS |
| 47: | drain high breakdown voltage NMOS |
| 48: | PMOS |
| 49: | PMOS |
| 50: | drain high breakdown voltage NMOS |
| 51: | PMOS |
| 52: | PMOS |
| 53: | drain high breakdown voltage PMOS |
| 54: | drain high breakdown voltage NMOS |

| Reference Signs List (3) | |
|---|---|
| 55: | current feed capacity UP switching element |
| 56: | unsaturated region |
| 57: | saturated region |
| 58: | fall time |
| 59: | inverter |
| 60: | NMOS |
| 61: | NMOS |
| 62: | resistor |
| 63: | NMOS |
| 64: | NMOS |
| 65: | NMOS |
| 66: | drain high breakdown voltage NMOS |
| 67: | drain high breakdown voltage NMOS |
| 68: | PMOS |
| 69: | PMOS |
| 70: | resistor |
| 71: | NMOS |
| 72: | NMOS |
| 73: | inverter |
| 74: | first constant current circuit |
| 75: | second constant current circuit |
| 76: | inverter |
| 77: | NMOS |
| 78: | NMOS |
| 79: | PMOS |
| 80: | PMOS |
| 81: | inverter |

The invention claimed is:

1. A level shift circuit comprising:
a signal input terminal for receiving an input signal to be level shifted;
a first level shift circuit;
a second level shift circuit;
a comparator circuit; and
a reference voltage supply, wherein:
the signal input terminal is connected to a first VIN terminal of the first level shift circuit and a second VIN terminal of the second level shift circuit,
the first level shift circuit is connected, at its first power supply terminal, to a first high potential side power supply, connected, at its second power supply terminal, to a second high potential side power supply and connected, at its earth terminal, to a low potential side power supply,
the second level shift circuit is connected, at its first power supply terminal, to the first high potential side power supply, connected, at its second power supply terminal, to the second high potential side power supply and connected, at its earth terminal, to the low potential side power supply,
a power supply ON/OFF operation of the first level shift circuit and a power supply ON/OFF operation of the second level shift circuit are controlled in accordance with an output from the comparator circuit, and
the comparator circuit is configured to compare a second high potential side power supply voltage inputted from outside with an output voltage of the reference voltage supply.

2. The level shift circuit as set forth in claim 1, further comprising:
a signal output terminal, wherein:
the first level shift circuit is configured such that:
the first level shift circuit includes a first SW terminal,
a first inverter, a second inverter and first AND are connected, at their respective power supply terminals, to the first high potential side power supply and connected, at their respective earth terminals, to the low potential side power supply, the first SW terminal is connected to an input of the first
inverter and to gates of first NMOS, a second NMOS
and a third NMOS, the first inverter is connected, at its output, to one of
inputs of the first AND and to gates of a fourth NMOS
and a first drain high breakdown voltage NMOS, the fourth NMOS is connected, at its drain, to the second
high potential side power supply through a first resistor and a second resistor, a first node, at which the first resistor and the second
resistor are interconnected, is connected to gates of a
first drain high breakdown voltage PMOS, a second
drain high breakdown voltage PMOS and a third drain
high breakdown voltage PMOS, the first drain high breakdown voltage PMOS and the
second drain high breakdown voltage PMOS are connected, at their respective sources, to the second high
potential side power supply, the first VIN terminal is connected to the other input of
the first AND and a pair of input MOS transistor
NMOSs are receive, at their gates, an output of the
first AND and its inversion signal outputted from the
second inverter, respectively, one of the pair of input MOS transistor NMOSs and
another of the pair of input MOS transistor NMOSs
are connected, at their respective sources, to the low
potential side power supply, the one of the pair of input MOS transistor NMOSs is
connected, at its drain, to a drain of a first PMOS, the another of the pair of input MOS transistor NMOSs
is connected, at its drain, to a drain of a second PMOS, the first PMOS is connected, at its gate, to the drain of the
second PMOS and the second PMOS is connected, at
its gate, to the drain of the first PMOS, the another of the pair of input MOS transistor NMOSs
is connected, at its drain, to gates of a third PMOS and
a fifth NMOS, the fifth NMOS is connected, at its source, to the low
potential side power supply, drains of the third PMOS and the fifth NMOS are connected to each other and their outputs are inputted to
gates of a fourth PMOS and sixth NMOS, the sixth NMOS is connected, at its source, to the low
potential side power supply and connected, at its
drain, to a drain of the fourth PMOS through the first
drain high breakdown voltage NMOS and the third
drain high breakdown voltage PMOS, the first PMOS, the second PMOS and the third PMOS
are connected, at their respective sources, to a drain of
the first drain high breakdown voltage PMOS, the fourth PMOS is connected, at its source, to a drain of
the second drain high breakdown voltage PMOS, the signal output terminal is connected to drains of the
first drain high breakdown voltage NMOS and the
third drain high breakdown voltage PMOS, the first NMOS is connected, at its drain, to the first drain
of the drain high breakdown voltage PMOS, the second NMOS is connected, at its drain, to the gate of
the sixth NMOS, the third NMOS is connected, at its drain, to a source of
the first drain high breakdown voltage NMOS, and the fourth NMOS, the first NMOS, the second NMOS
and the third NMOS are connected, at their respective
sources, to the low potential side power supply.

3. The level shift circuit as set forth in claim 2, wherein:
the first level shift circuit is further configured such that:
a seventh NMOS is connected, at its drain, to the second
high potential side power supply through a third resistor
and a fourth resistor, a second node, at which the third resistor and the fourth
resistor are interconnected, is connected to a gate of a
fifth PMOS, an eighth NMOS is connected, at its drain, to the second
high potential side power supply through a fifth resistor,
a sixth resistor and the fifth PMOS, third node, at which the fifth resistor and the sixth resistor
are interconnected, is connected to a source of the third
drain high breakdown voltage PMOS and a first output
terminal of the first level shift circuit, and the seventh NMOS and the eighth NMOS are connected, at
their respective sources, to the low potential side power
supply and connected, at their respective gates, to the
first SW terminal.

4. The level shift circuit as set forth in claim 1, further
comprising:
a signal output terminal,
wherein the second level shift circuit is configured such
that:
the second level shift circuit includes a second SW terminal,
a third inverter, a NOR and second AND are connected,
at their respective power supply terminals, to the first
high potential side power supply and connected, at
their respective earth terminals, to the low potential
side power supply, the second VIN terminal is connected to one of inputs of
the NOR and one of inputs of the second AND, the NOR is connected, at its output, to gates of a second
drain high breakdown voltage NMOS and a third
drain high breakdown voltage NMOS, the second AND is connected, at its output, to a gate of
a fourth drain high breakdown voltage NMOS, the fourth drain high breakdown voltage NMOS, the
second drain high breakdown voltage NMOS and the
third drain high breakdown voltage NMOS are connected, at their respective sources, to the low potential
side power supply, a fourth drain high breakdown voltage PMOS is connected, at its source, to the second high potential side
power supply and connected, at its drain, to a drain of
the third drain high breakdown voltage NMOS and to
the signal output terminal, the fourth drain high breakdown voltage NMOS is connected, at its drain, to the second high potential side
power supply through a sixth PMOS and a seventh
PMOS, the sixth PMOS is connected, at its source, to a gate of
the fourth drain high breakdown voltage PMOS, a
drain of a seventh PMOS and a drain of an eighth
PMOS and connected, at its gate, to the first high
potential side power supply, the seventh PMOS is connected, at its source, to the
second high potential side power supply, the second drain high breakdown voltage NMOS is connected, at its drain, to the second high potential side
power supply through a ninth PMOS and a tenth
PMOS, the ninth PMOS is connected, at its source, to a gate of
the seventh PMOS and connected, at its gate, to the
first high potential side power supply, the second SW terminal is connected to the other input of the second AND and an input of the third inverter and a gate of ninth NMOS, the third inverter is connected, at its output, to another input of the NOR and a gate of a fifth drain high breakdown voltage NMOS, the ninth NMOS is connected, at its source, to the low potential side power supply through a current source and connected, at its drain, to the second high potential side power supply through a eleventh PMOS, a drain and gate of the eleventh PMOS are connected to a gate of the seventh PMOS and a gate of the tenth PMOS, the eleventh PMOS is connected, at its gate, to a drain of a twelfth PMOS, the fifth drain high breakdown voltage NMOS is connected, at its source, to the low potential side power supply and connected, at its drain, to the second high potential side power supply through a seventh resistor an eighth resistor, a fourth node, at which the seventh resistor and the eighth resistor are interconnected, is connected to gates of the twelfth PMOS and the eighth PMOS, and the twelfth PMOS and the eighth PMOS are connected, at their respective sources, to the second high potential side power supply.

5. The level shift circuit as set forth in claim 1, wherein:
the first level shift circuit includes a first SW terminal,
the second level shift circuit includes a second SW terminal,
the output of the comparator circuit is connected to the first SW terminal and the second SW terminal.

6. The level shift circuit as set forth in claim 2, wherein the second level shift circuit is configured such that:

the second level shift circuit includes a second SW terminal, a third inverter, a NOR and second AND are connected, at their respective power supply terminals, to the first high potential side power supply and connected, at their respective earth terminals, to the low potential side power supply, the second VIN terminal is connected to one of inputs of the NOR and one of inputs of the second AND, the NOR is connected, at its output, to gates of a second drain high breakdown voltage NMOS and a third drain high breakdown voltage NMOS, the second AND is connected, at its output, to a gate of a fourth drain high breakdown voltage NMOS, the fourth drain high breakdown voltage NMOS, the second drain high breakdown voltage NMOS and the third drain high breakdown voltage NMOS are connected, at their respective sources, to the low potential side power supply, a fourth drain high breakdown voltage PMOS is connected, at its source, to the second high potential side power supply and connected, at its drain, to a drain of the third drain high breakdown voltage NMOS and to the signal output terminal, the fourth drain high breakdown voltage NMOS is connected, at its drain, to the second high potential side power supply through a sixth PMOS and a seventh PMOS, the sixth PMOS is connected, at its source, to a gate of the fourth drain high breakdown voltage PMOS, a drain of a seventh PMOS and a drain of an eighth PMOS and connected, at its gate, to the first high potential side power supply, the seventh PMOS is connected, at its source, to the second high potential side power supply, the second drain high breakdown voltage NMOS is connected, at its drain, to the second high potential side power supply through a ninth PMOS and a tenth PMOS, the ninth PMOS is connected, at its source, to a gate of the seventh PMOS and connected, at its gate, to the first high potential side power supply, the second SW terminal is connected to the other input of the second AND and an input of the third inverter and a gate of ninth NMOS, the third inverter is connected, at its output, to another input of the NOR and a gate of a fifth drain high breakdown voltage NMOS, the ninth NMOS is connected, at its source, to the low potential side power supply through a current source and connected, at its drain, to the second high potential side power supply through an eleventh PMOS, a drain and gate of the eleventh PMOS are connected to a gate of the seventh PMOS and a gate of the tenth PMOS, the eleventh PMOS is connected, at its gate, to a drain of a twelfth PMOS, the fifth drain high breakdown voltage NMOS is connected, at its source, to the low potential side power supply and connected, at its drain, to the second high potential side power supply through a seventh resistor and an eighth resistor, a fourth node, at which the seventh resistor and the eighth resistor are interconnected, is connected to gates of the twelfth PMOS and the eighth PMOS, and the twelfth PMOS and the eighth PMOS are connected, at their respective sources, to the second high potential side power supply.

7. The level shift circuit as set forth in claim 6, further comprising:
a second signal output terminal,
wherein:
the first level shift circuit is further configured such that:
a seventh NMOS is connected, at its drain, to the second high potential side power supply through a third resistor and a fourth resistor,
a second node, at which the third resistor and the fourth resistor are interconnected, is connected to a gate of a fifth PMOS,
an eighth NMOS is connected, at its drain, to the second high potential side power supply through a fifth resistor, a sixth resistor and the fifth PMOS,
a third node, at which the fifth resistor and the sixth resistor are interconnected, is connected to a source of the third drain high breakdown voltage PMOS and the second output terminal of the first level shift circuit, and
the seventh NMOS and the eighth NMOS are connected, at their respective sources, to the low potential side power supply and connected, at their respective gates, to the first SW input terminal.

8. A level shift circuit, comprising:
a signal input terminal;
a switch terminal; and
a first signal output terminal, wherein:
the level shift circuit is configured such that:
a first inverter, a second inverter and first AND are connected, at their respective power supply terminals, to a first high potential side power supply and connected, at their respective earth terminals, to a low potential side power supply, the switch terminal is connected to an input of the first inverter and to gates of first NMOS, a second NMOS and a third NMOS, the first inverter is connected, at its output, to one of inputs of the first AND and to gates of a fourth NMOS and a first drain high breakdown voltage NMOS, the fourth NMOS is connected, at its drain, to a second high potential side power supply through a first resistor and a second resistor, a first node, at which the first resistor and the second resistor are interconnected, is connected to gates of a first drain high breakdown voltage PMOS, a second drain high breakdown voltage PMOS and a third drain high breakdown voltage PMOS, the first drain high breakdown voltage PMOS and the second drain high breakdown voltage PMOS are connected, at their respective sources, to the second high potential side power supply, the signal input terminal is connected to the other input of the first AND and a pair of input MOS transistor NMOSs are receive, at their gates, an output of the first AND and its inversion signal outputted from the second inverter, respectively, one of the pair of input MOS transistor NMOSs and another of the pair of input MOS transistor NMOSs are connected, at their respective sources, to the low potential side power supply, the one of the pair of input MOS transistor NMOSs is connected, at its drain, to a drain of a first PMOS, the another of the pair of input MOS transistor NMOSs is connected, at its drain, to a drain of a second PMOS, the first PMOS is connected, at its gate, to the drain of the second PMOS and the second PMOS is connected, at its gate, to the drain of the first PMOS, the another of the pair of input MOS transistor NMOSs is connected, at its drain, to gates of a third PMOS and a fifth NMOS, the fifth NMOS is connected, at its source, to the low potential side power supply, drains of the third PMOS and the fifth NMOS are connected to each other and their outputs are inputted to gates of a fourth PMOS and sixth NMOS, the sixth NMOS is connected, at its source, to the low potential side power supply and connected, at its drain, to a drain of the fourth PMOS through the first drain high breakdown voltage NMOS and the third drain high breakdown voltage PMOS, the first PMOS, the second PMOS and the third PMOS are connected, at their respective sources, to a drain of the first drain high breakdown voltage PMOS, the fourth PMOS is connected, at its source, to a drain of the second drain high breakdown voltage PMOS, the signal output terminal is connected to drains of the first drain high breakdown voltage NMOS and the third drain high breakdown voltage PMOS, the first NMOS is connected, at its drain, to the first drain of the drain high breakdown voltage PMOS, the second NMOS is connected, at its drain, to the gate of the sixth NMOS, the third NMOS is connected, at its drain, to a source of the first drain high breakdown voltage NMOS, and the fourth NMOS, the first NMOS, the second NMOS and the third NMOS are connected, at their respective sources, to the low potential side power supply, and a power supply ON/OFF operation of the level shift circuit is controlled in accordance with a signal inputted to the switch terminal.

9. The level shift circuit as set forth in claim 8, wherein:
the level shift circuit is further configured such that:
the level shift circuit further includes a second signal output terminal, a seventh NMOS is connected, at its drain, to the second high potential side power supply through a third resistor and a fourth resistor, a second node, at which the third resistor and the fourth resistor are interconnected, is connected to a gate of a fifth PMOS, an eighth NMOS is connected, at its drain, to the second high potential side power supply through a fifth resistor, a sixth resistor and the fifth PMOS, a third node, at which the fifth resistor and the sixth resistor are interconnected, is connected to a source of the third drain high breakdown voltage PMOS and the second signal output terminal, and the seventh NMOS and the eighth NMOS are connected, at their respective sources, to the low potential side power supply and connected, at their respective gates, to the switch input terminal.

10. A level shift circuit, comprising:
a signal input terminal;
a switch terminal; and
a signal output terminal,
wherein the level shift circuit is configured such that:
a third inverter, a NOR and second AND are connected, at their respective power supply terminals, to the first high potential side power supply and connected, at their respective earth terminals, to the low potential side power supply, the signal input terminal is connected to one of inputs of the NOR and one of inputs of the second AND, the NOR is connected, at its output, to gates of a second drain high breakdown voltage NMOS and a third drain high breakdown voltage NMOS, the second AND is connected, at its output, to a gate of a fourth drain high breakdown voltage NMOS, the fourth drain high breakdown voltage NMOS, the second drain high breakdown voltage NMOS and the third drain high breakdown voltage NMOS are connected, at their respective sources, to the low potential side power supply, a fourth drain high breakdown voltage PMOS is connected, at its source, to the second high potential side power supply and connected, at its drain, to a drain of the third drain high breakdown voltage NMOS and to the signal output terminal, the fourth drain high breakdown voltage NMOS is connected, at its drain, to the second high potential side power supply through a sixth PMOS and a seventh PMOS, the sixth PMOS is connected, at its source, to a gate of the fourth drain high breakdown voltage PMOS , a drain of the seventh PMOS and a drain of an eighth PMOS and a drain of a thirteenth PMOS and connected, at its gate, to the first high potential side power supply, the seventh PMOS is connected, at its source, to the second high potential side power supply, the second drain high breakdown voltage NMOS is connected, at its drain, to the second high potential side power supply through a ninth PMOS and a tenth PMOS, the ninth PMOS is connected, at its source, to a gate of the eighth PMOS and connected, at its gate, to the first high potential side power supply, the second SW terminal is connected to the other input of the second AND and an input of the third inverter and a gate of ninth NMOS, the third inverter is connected, at its output, to another input of the NOR and a gate of a fifth drain high breakdown voltage NMOS, the ninth NMOS is connected, at its source, to the low potential side power supply through a current source and connected, at its drain, to the second high potential side power supply through a eleventh PMOS, a drain and gate of the eleventh PMOS are connected to a gate of the seventh PMOS and a gate of the tenth PMOS, the eleventh PMOS is connected, at its gate, to a drain of a twelfth PMOS, the fifth drain high breakdown voltage NMOS is connected, at its source, to the low potential side power supply and connected, at its drain, to the second high potential side power supply through a seventh resistor and an eighth resistor, a fourth node, at which the seventh resistor and the eighth resistor are interconnected, is connected to gates of the twelfth PMOS and the thirteenth PMOS, and the twelfth PMOS and the eighth PMOS and the thirteenth PMOS are connected, at their respective sources, to the second high potential side power supply, and a power supply ON/OFF operation of the level shift circuit is controlled in accordance with a signal inputted to the switch terminal.

\* \* \* \* \*